US012771415B2

(12) United States Patent
Lee

(10) Patent No.: US 12,771,415 B2
(45) Date of Patent: Oct. 20, 2026

(54) METHOD FOR ENCODING AND DECODING BASED ON IMPROVED DEEP POLARIZATION AND APPARATUS THEREFOR

(71) Applicant: Nam Yoon Lee, Seoul (KR)

(72) Inventor: Nam Yoon Lee, Seoul (KR)

(73) Assignee: Nam Yoon Lee, Seoul (KR)

( * ) Notice: Subject to any disclaimer, the term of this patent is extended or adjusted under 35 U.S.C. 154(b) by 0 days.

(21) Appl. No.: 18/529,006

(22) Filed: Dec. 5, 2023

(65) Prior Publication Data

US 2024/0204835 A1 Jun. 20, 2024

(30) Foreign Application Priority Data

Dec. 5, 2022 (KR) ........................ 10-2022-0167300
May 22, 2023 (KR) ........................ 10-2023-0065479
Jul. 18, 2023 (KR) ........................ 10-2023-0093191
Aug. 23, 2023 (KR) ........................ 10-2023-0110701

(51) Int. Cl.
*H04B 7/0456* (2017.01)
*H03M 13/13* (2006.01)
*H04L 1/00* (2006.01)

(52) U.S. Cl.
CPC .......... *H04B 7/0478* (2013.01); *H03M 13/13* (2013.01); *H04B 7/0482* (2013.01); *H04L 1/0057* (2013.01)

(58) Field of Classification Search
CPC ... H03M 13/13; H04B 7/0478; H04B 7/0482; H04L 1/0057
USPC .......................................................... 375/262
See application file for complete search history.

(56) References Cited

U.S. PATENT DOCUMENTS

2018/0183464 A1* 6/2018 Ge ........................ H03M 13/13
2021/0328600 A1 10/2021 Gross et al.

FOREIGN PATENT DOCUMENTS

WO WO-2020108586 A1 * 6/2020 ............ H03M 13/13

* cited by examiner

*Primary Examiner* — Leila Malek
(74) *Attorney, Agent, or Firm* — Hoffman Warnick LLC

(57) ABSTRACT

Disclosed are a method for encoding and decoding based on improved deep polarization and an apparatus thereof. A code encoding method performed by an encoding device includes determining a first channel group connected to a lower encoding matrix and a second channel group connected to an upper encoding matrix and the lower encoding matrix among a plurality of polarized channels based on a weight of each of the polarized channels, the weight of each of the polarized channels being defined according to the number of specific binary data on a bit generated by each of the channels being polarized; and generating codewords by mapping information bits to the upper encoding matrix and the lower encoding matrix and assigning the generated codewords to the first channel group and the second channel group.

22 Claims, 20 Drawing Sheets

CRC-aided deep-polar encoder with L layers (Variant 1)

CRC-aided deep-polar encoder with L layers (Variant 2)

Genenalization with multiple connection sets per layer (Variant 3)

Decoder 2 : SCL decoder with back propagation parity checks $$(\hat{u}_{L_L}, \hat{u}_{A_L})$$

$$(\hat{u}_{A_\ell}, T_{\ell-1}^{-1})_{F_{\ell-1}} = 0 \quad \text{for } \ell \in \{L, L-1, \ldots, 2\}$$

$$T_\ell^{-1} = (G_\ell^T)^{-1} = G_\ell$$

$$(\hat{u}_{A_\ell}, G_{\ell-1})_{F_{\ell-1}} = 0$$

Decoder 2 - Variant: SCL decoder with back propagation parity checks + CRC $$T_\ell^{-1} = (G_\ell^T)^{-1} = G_\ell$$
$$(\hat{u}_{A_\ell} . G_{\ell-1})_{F_{\ell-1}} = 0$$

FIG. 6F

Decoder 4: Back propagation parity check decoding with random noise guessing

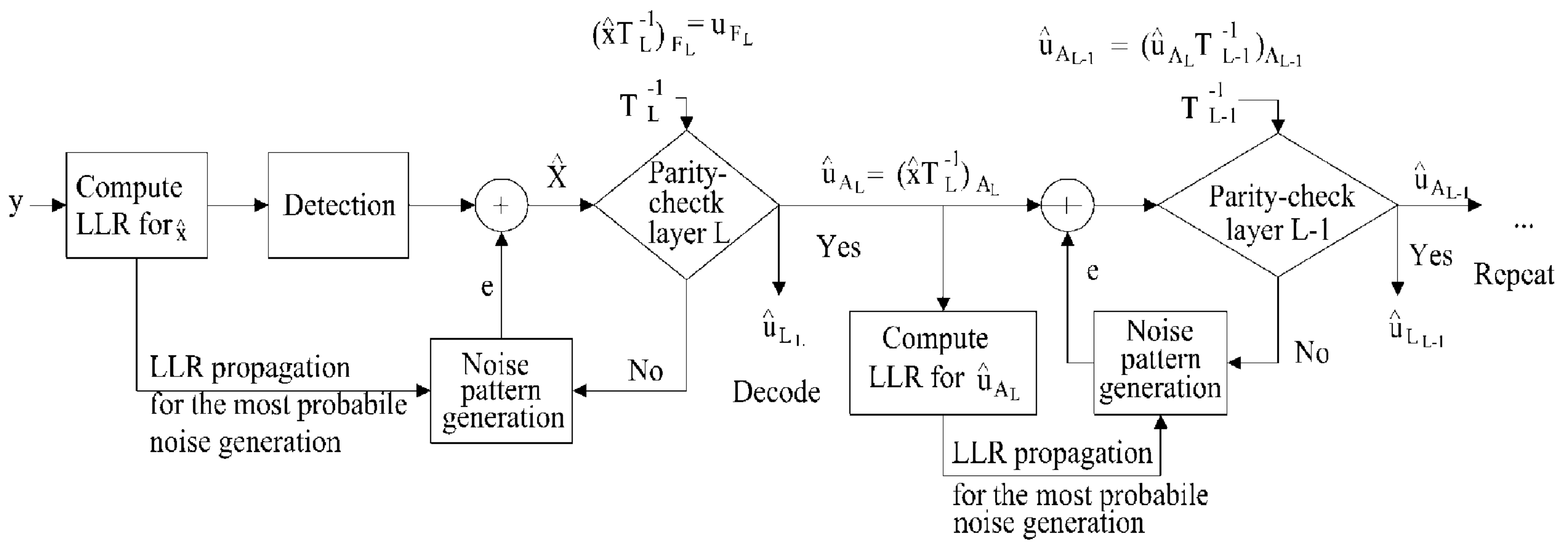

Step 1: Recover the outvector of each layer using noise guessing type decoder per layer until the parity check of the layer is success
Step 2: Back propagate the LLR values of the output vector to the input vector, which is the output of the previous input vector
Step 3: Using the back propagated LLR values, perform noise guessing thpe decoding until the parity check of the layer is success
Step 4: Repeat this to whent it reaches to the first layer

METHOD FOR ENCODING AND DECODING BASED ON IMPROVED DEEP POLARIZATION AND APPARATUS THEREFOR

CROSS-REFERENCE TO RELATED APPLICATION(S)

This application claims the priority benefit of Korean Patent Application No. 10-2022-0167300, filed on Dec. 5, 2022, Korean Patent Application No. 10-2023-0065479, filed on May 22, 2023, Korean Patent Application No. 10-2023-0093191, filed on Jul. 18, 2023, and Korean Patent Application No. 10-2023-0110701, filed on Aug. 23, 2023 in the Korean Intellectual Property Office, the disclosure of which is incorporated herein by reference.

BACKGROUND

1. Field of the Invention

Example embodiments relate to technology related to a method for encoding and decoding improved deep polarization and an apparatus thereof.

2. Description of the Related Art

In a communication system or a memory system, data to be transmitted may be transmitted through a physical channel, for example, a wired communication channel, a wireless communication channel, and a storage medium. In a process in which the data is transmitted through the physical channel, noise may be mixed or data may be partially lost, making restoration difficult.

As technology for detecting and correcting errors that occur in transmission data, error correcting codes are being studied. For example, encoding technology using a polar code that is one of the error correcting codes is developed. The polar code refers to a code that corrects an error based on channel polarization in a physical channel that transmits data or a channel polarization phenomenon.

The existing encoding method of using the polar code uses a polar kernel matrix connected to a single layer while constructing an encoding device with the single layer and thus, has a disadvantage in that a decoding error occurs for short-length information bits.

Therefore, there is a need to propose technology for solving the disadvantage that a decoding error occurs for short-length information bits.

SUMMARY

To ensure low-decoding complexity and solve a disadvantage that a decoding error occurs for short-length information bits, example embodiments provide an encoding device that may perform deep polar encoding using polar kernel matrices respectively connected to a plurality of matrices and a decoding device that may perform back-propagation-based deep polar decoding corresponding thereto.

Here, the technical subjects to be solved by the disclosure are not limited to the aforementioned subjects and may be expanded in various ways without departing from the technical spirit and scope of the disclosure.

According to an example embodiment, an encoding device for performing code encoding may generates a codeword using polar kernel matrices respectively connected to a plurality of layers.

According to an aspect, the polar kernel matrices respectively connected to the plurality of layers may have different matrix sizes.

According to another aspect, the polar kernel matrices respectively connected to the plurality of layers may have smaller matrix sizes as going along an upper layer from an output end to an input end of the encoding device.

According to still another aspect, polar kernel matrices respectively connected to remaining layers excluding a bottom layer provided at the output end of the encoding device among the plurality of layers may have a transpose relationship with a polar kernel matrix connected to the bottom layer.

According to still another aspect, at least one polar kernel matrix included in the polar kernel matrices may be connected to each of the plurality of layers.

According to still another aspect, the encoding device may successively and alternately use an upper triangular matrix and a lower triangular matrix for the polar kernel matrices respectively connected to the plurality of layers.

According to still another aspect, a polar kernel matrix used in a layer immediately preceding a bottom layer provided at an output end of the encoding device among the plurality of layers may be the upper triangular matrix when a polar kernel matrix used in the bottom layer is the lower triangular matrix and may be the lower triangular matrix when the polar kernel matrix used in the bottom layer is the upper triangular matrix.

According to still another aspect, the encoding device may generate the codeword using a successive encoding method based on a linear or nonlinear function using a partial connection between the plurality of layers.

According to still another aspect, the encoding device may generate the codeword using a successive encoding method of using cyclic redundancy check (CRC) precoding for at least some of information bits.

According to still another aspect, the encoding device may use at least one bit among an information bit, a connection bit, and a frozen bit as an input bit of encoding in each of the plurality of layers and an input position of each of the information bit, the input bit, and the frozen bit may be configured to not overlap.

According to still another aspect, a codeword output as an output value of encoding in each of the plurality of layers may be determined based on a polar kernel matrix used in each of the plurality of layers, the connection bit, and the information bit and may be used as an input of a connection bit of the encoding in an immediately following layer.

According to still another aspect, an input position of an information bit of encoding in each of the plurality of layers may be selected as a position at which a bit channel capacity is greater than or equal to a preset value based on a channel status and a polar kernel matrix used in each of the plurality of layers, and an input position of a connection bit of encoding in each of the plurality of layers may be selected as at least one position at which the bit channel capacity is greater than or equal to the preset value excluding a position at which the information bit is assigned among row positions at which a weight size of rows of the polar kernel matrix used in each of the plurality of layers is greater than or equal to the preset value.

According to still another aspect, the encoding device may retransmit at least some of output values of encoding in each of the plurality of layers when retransmission is required in a communication environment.

According to an example embodiment, a decoding device for performing code decoding may use, as a parity bit, a frozen bit for each layer used for encoding in each of a plurality of layers included in an encoding device when decoding.

According to an aspect, the decoding device may use, as parity bits, frozen bits used for encoding of remaining layers excluding a bottom layer provided at an output end of the encoding device among the plurality of layers while decoding a connection bit used for encoding of the bottom layer based on a frozen bit used for encoding of the bottom layer among the plurality of layers.

According to another aspect, the decoding device may successively perform parity bit check in a backpropagation structure.

According to still another aspect, the decoding device may perform decoding using at least some of output values of encoding in each of the plurality of layers previously received from the encoding device and at least some of output values of encoding in each of the plurality of layers received again from the encoding device.

According to still another aspect, the decoding device may decode a connection bit used for encoding of a bottom layer provided at an output end of the encoding device among the plurality of layers using a pattern of a connection bit available for encoding of the bottom layer as an additional frozen bit.

According to still another aspect, the decoding device may generate in advance the pattern of the connection bit available for encoding of the bottom layer, may decode information bits in parallel by simultaneously using the generated connection bit and the frozen bit, and may select and decode an information bit having a highest reliability among the decoded information bits and a connection bit corresponding to the information bit having the highest reliability.

According to still another aspect, the decoding device may decode an information bit and a connection bit used for encoding of a layer immediately preceding the bottom layer through an inverse matrix of an encoding matrix used for encoding of the layer immediately preceding the bottom layer, based on the decoded connection bit as the connection bit used for encoding of the bottom layer, and may decode an information bit used for encoding of the immediately preceding layer.

According to still another aspect, the decoding device may decode an information bit and a connection bit used for encoding of an (L-1)-th layer through an inverse matrix of an encoding matrix used for encoding of the (L-1)-th layer that is a layer immediately preceding an L-th layer among the plurality of layers based on a connection bit used for encoding of the L-th layer, and may decode an information bit used for encoding of the (L-1)-th layer.

According to an example embodiment, a decoding device for performing code decoding may compute a long likelihood ratio (LLR) of a received signal that is received from an encoding device according to a guessing random additive noise decoding (GRAND) rule, may estimate a transmission codeword by inverting bits of the received signal in descending order of the LLR, and may determine the estimated transmission codeword as a codeword transmitted from the encoding device by sequentially verifying a layer-by-layer parity bit of each of a plurality of layers included in the encoding device in a backpropagation structure using the estimated transmission codeword and an inverse matrix of a polar kernel matrix used for encoding of each of the plurality of layers.

According to an aspect, the decoding device may compute an LLR of each of connection bits for each of the plurality of layers, may estimate the layer-by-layer connection bit in descending order among the layer-by-layer connection bits, and then successively backpropagate an LLR of a connection bit of a corresponding immediately preceding layer when verification of the layer-by-layer parity bit succeeds.

According to an example embodiment, a decoding device for performing code decoding may perform a backpropagation LLR that sequentially computes an LLR of a connection bit of each of a plurality of layers included in a encoding device using a belief propagation (BP) algorithm based on a received signal received from the encoding device and a successive encoding structure of the plurality of layers.

According to an aspect, the decoding device may sequentially apply the BP algorithm using a parity check matrix present in a null space of an encoding matrix used for encoding of the plurality of layers, in a process of backpropagating the layer-by-layer LLR of each of the plurality of layers.

According to another aspect, the decoding device may perform backpropagation for the layer-by-layer LLR, may perform successive encoding using an information bit estimated for each of the plurality of layers and an LLR corresponding to the estimated information bit, and may perform LLR forward propagation of updating the LLR of the connection bit of each of the plurality of layers.

According to still another aspect, the decoding device may alternately perform backpropagation of the LLR and forward propagation of the LLR.

According to some example embodiments, by providing an encoding device that performs deep polar encoding using polar kernel matrices respectively connected to a plurality of layers and a decoding device that performs backpropagation-based deep polar decoding corresponding thereto, it is possible to accomplish the technical effect of solving a disadvantage that a decoding error occurs for short-length information bits while ensuring low decoding complexity.

However, the effect of the disclosure is not limited to the aforementioned effect and may be expanded in various ways without departing from the technical spirit and scope of the disclosure.

BRIEF DESCRIPTION OF THE DRAWINGS

These and/or other aspects, features, and advantages of the invention will become apparent and more readily appreciated from the following description of embodiments, taken in conjunction with the accompanying drawings of which:

FIGS. 6A to 6F illustrate examples of a structure of a decoding device based on improved deep polarization according to an example embodiment;

DETAILED DESCRIPTION

Figure 1:
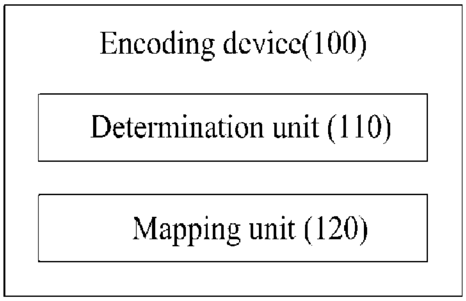
FIG. 1 is a block diagram illustrating an encoding device based on improved deep polarization according to an example embodiment.

Hereinafter, example embodiments will be described in detail with reference to the accompanying drawings. When describing the example embodiments with reference to the accompanying drawings, like reference numerals refer to like elements.

Also, the terms (terminology) used herein are those used to appropriately explain the example embodiments and may vary depending on intent of a viewer or an operator or customs of the field to which the example embodiments pertain. Therefore, the terms should be defined based on the overall contents of the present specification. For example, as used herein, the singular forms "a," "an," and "the" are intended to include the plural forms as well, unless the context clearly indicates otherwise. Also, it will be further understood that the terms "comprises" and/or "comprising," when used in this specification, specify the presence of stated features, integers, steps, operations, elements, components or a combination thereof, but do not preclude the presence or addition of one or more other features, integers, steps, operations, elements, components, and/or groups thereof. Also, although terms, "first," "second," and the like, are used to explain various regions, directions, and shapes, the regions, the directions, and the shapes should not be defined by such terms. The terms are used only to distinguish one region, direction, or shape from another region, direction, or shape. Therefore, a portion referred to as a first portion in an example embodiment may be termed a second portion in another example embodiment.

Also, it should be understood that various example embodiments differ from each other, but are not necessarily mutually exclusive. For example, a specific shape, structure, and feature described herein may be implemented in another example embodiment without departing from the technical spirit and scope of the disclosure. Also, it should be understood that a position, an arrangement, or a configuration of an individual component in the category of each example embodiment may be changed without departing from the technical spirit and scope of the disclosure.

A method for encoding and decoding based on improved deep polarization described below may solve a disadvantage that a decoding error occurs for short-length information bits while ensuring low decoding complexity by performing deep polar encoding using polar kernel matrices respectively connected to a plurality of layers and by performing back-propagation-based deep polar decoding corresponding thereto, and, at the same time, may prevent a degradation in a transmission rate performance in consideration of performance of each of channels with low complexity by assigning information bits and frozen bits based on a weight of each of the channels.

Figure 2:
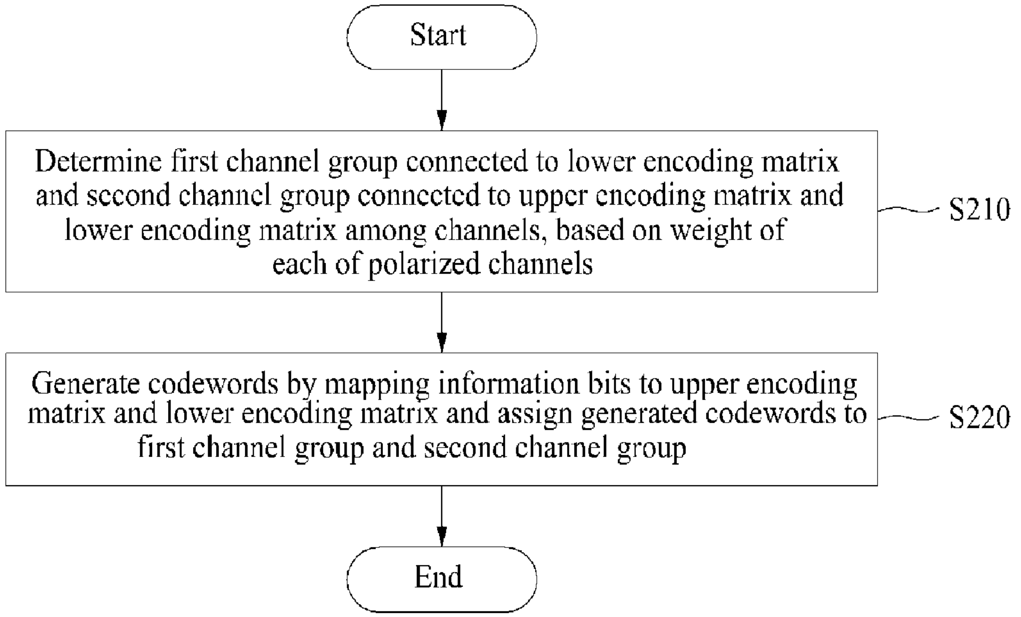
FIG. 2 is a flowchart illustrating an encoding method based on improved deep polarization according to an example embodiment.

FIG. 1 is a block diagram illustrating an encoding device based on improved deep polarization according to an example embodiment, and FIG. 2 is a flowchart illustrating an encoding method based on improved deep polarization according to an example embodiment.

Referring to FIGS. 1 and 2, an encoding device 100 according to an example embodiment may perform deep polarization-based encoding that generates a codeword using polar kernel matrices respectively connected to a plurality of layers. For example, as illustrated in FIG. 3B described below, the encoding device 100 may be implemented such that, while there are a first layer (Layer 1), a second layer (Layer 2), . . . , an (L-1)-th layer (Layer L-1), and an L-th layer (Layer L), a first polar kernel matrix is connected to the first layer (Layer 1), a second polar kernel matrix is connected to the second layer (Layer 2), an (L-1)-th polar kernel matrix is connected to the (L-1)-th layer (Layer L-1), and an L-th polar kernel matrix is connected to the L-th layer (Layer L).

Here, the polar kernel matrices respectively connected to the plurality of layers may construct a partial successive connection between layers with different matrix sizes. For example, the polar kernel matrices respectively connected to the plurality of layers may have smaller sizes as going along an upper layer from an output end to an input end of the encoding device 100. In detail, for example, as illustrated in FIG. 3B described below, the matrix size may be smaller as moving from the L-th layer (Layer L) (bottom layer) to the first layer (Layer 1) (top layer).

Here, polar kernel matrices respectively connected to remaining layers excluding the bottom layer provided at the output end of the encoding device 100 among the plurality of layers may have a transpose relationship with a polar kernel matrix connected to the bottom layer. For example, as illustrated in FIG. 3B described below, the first polar kernel matrix connected to the first layer (Layer 1), the second polar kernel matrix connected to the second layer (Layer 2), and the (L-1)-th polar kernel matrix connected to the (L-1)-th layer (Layer L-1) may have a transpose relationship with the L-th polar kernel matrix connected to the L-th layer (Layer L).

Figure 3A:
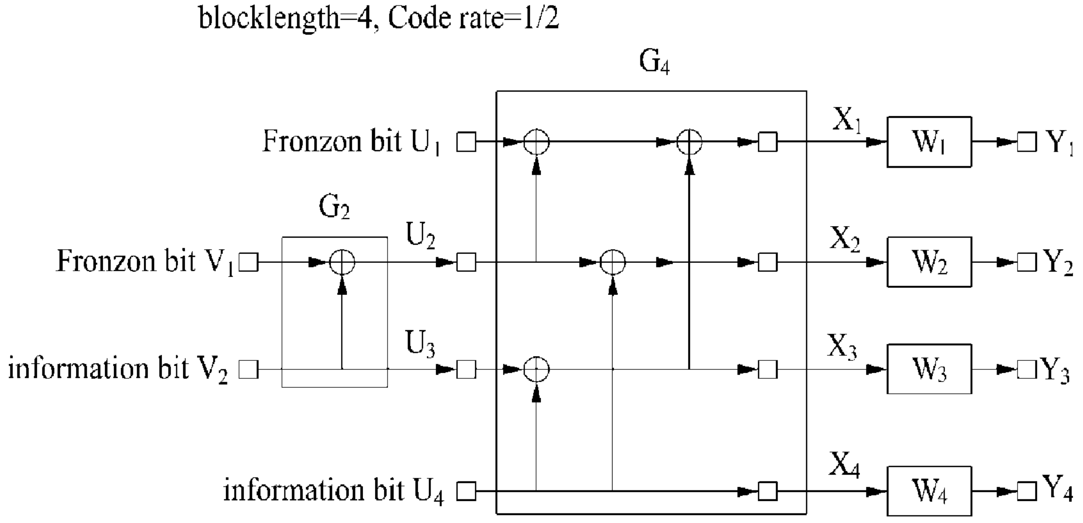
FIGS. 3A to 3G illustrate examples of a structure of an encoding device based on improved deep polarization according to an example embodiment.
Figure 3B:
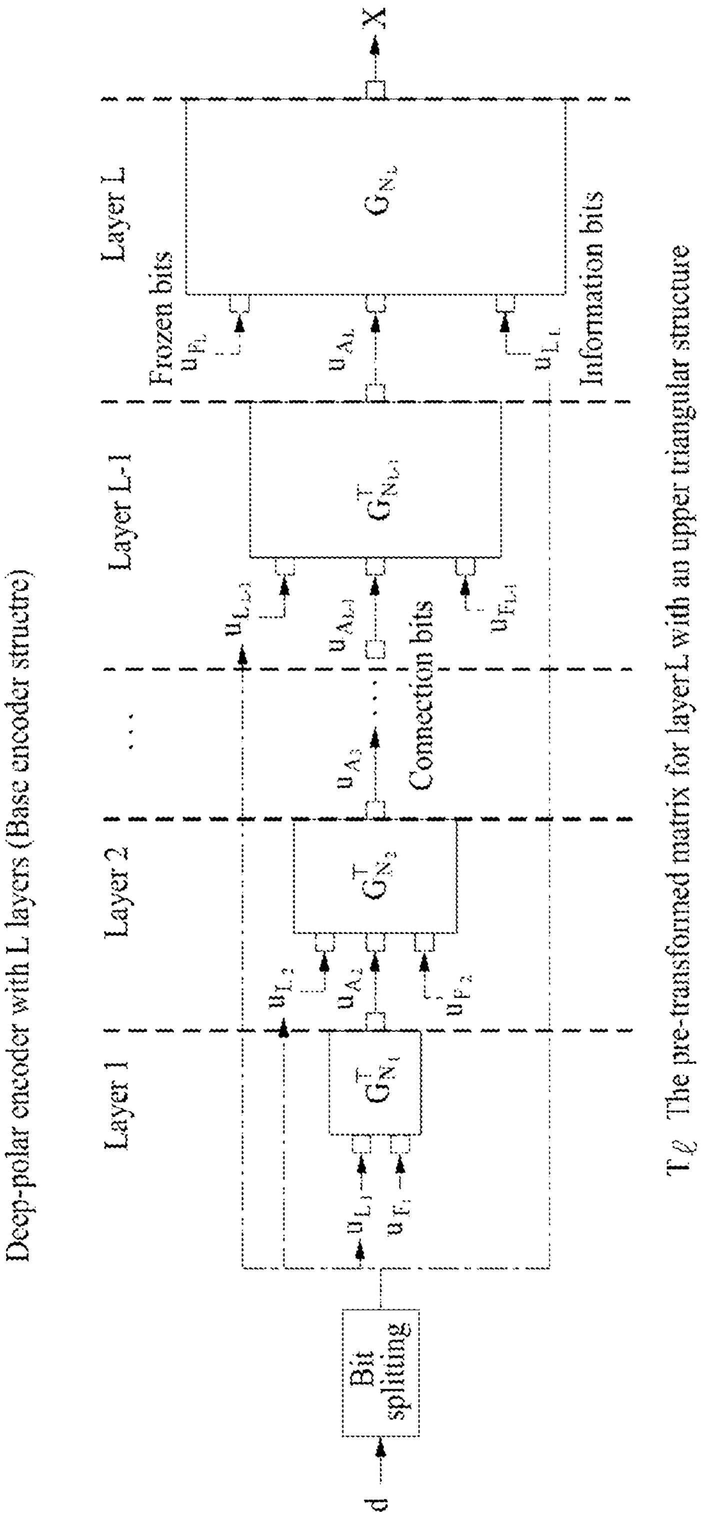
Figure 3C:
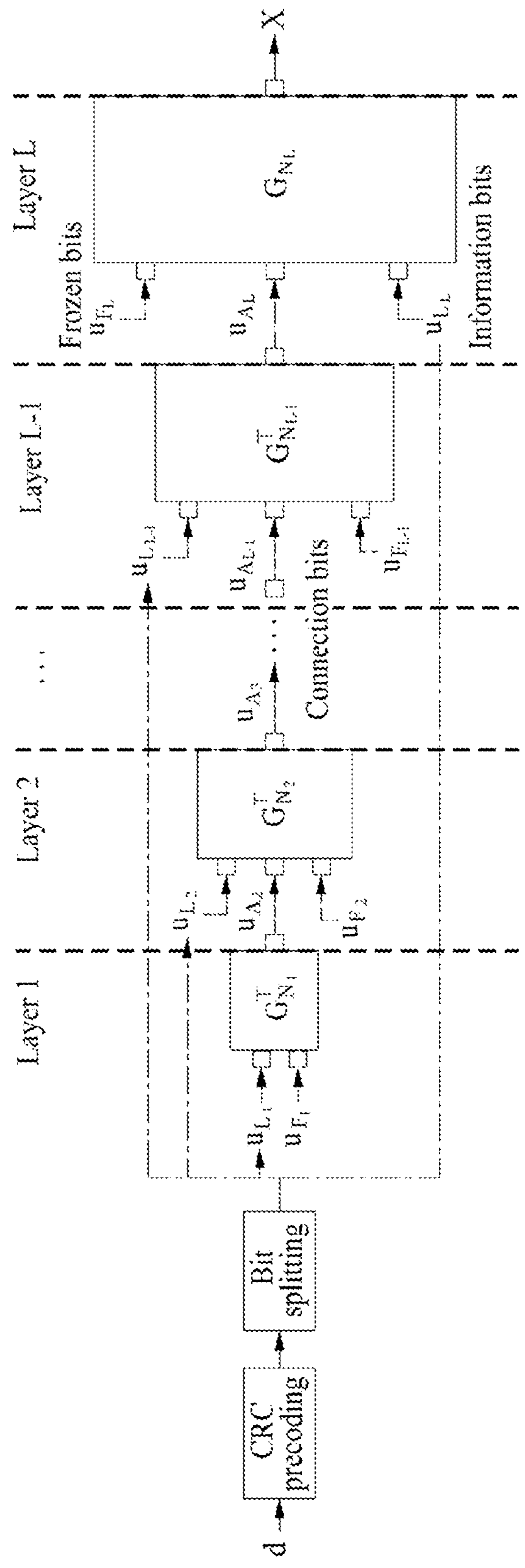
Figure 3D:
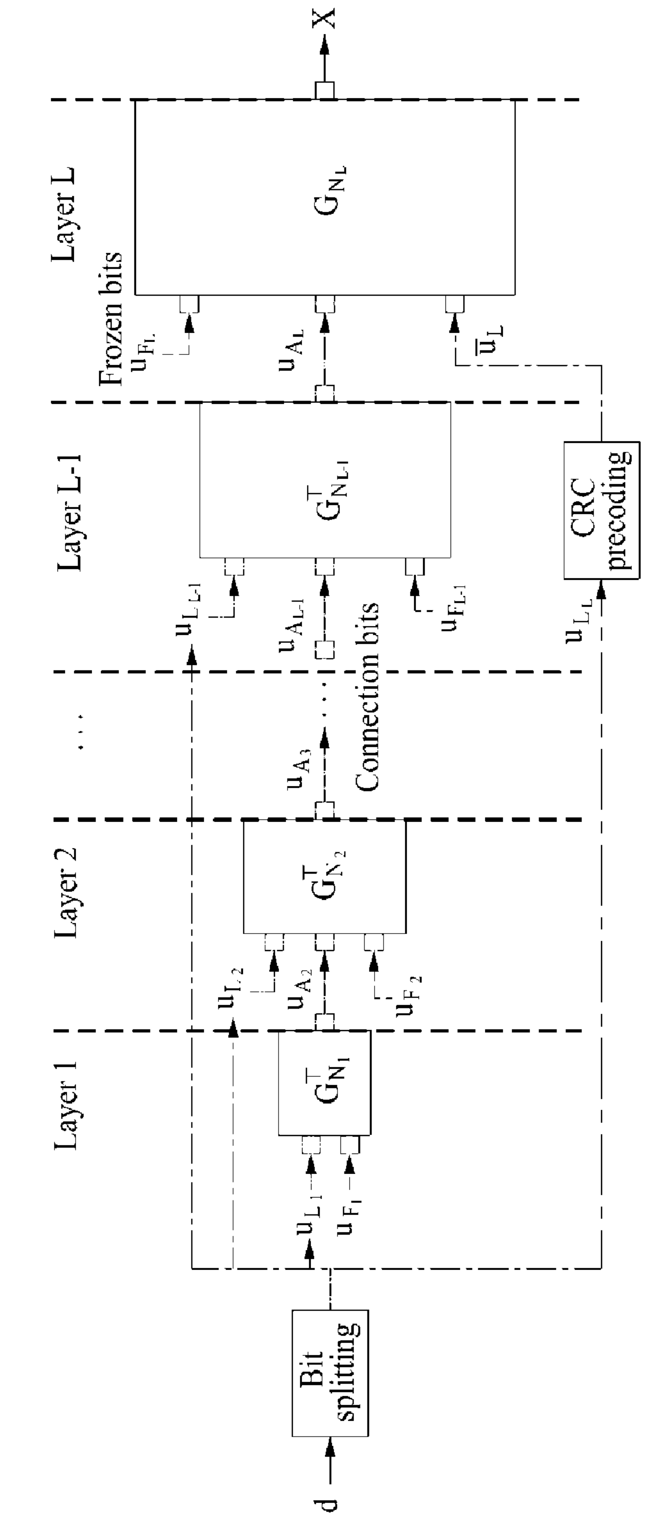
Figure 3E:
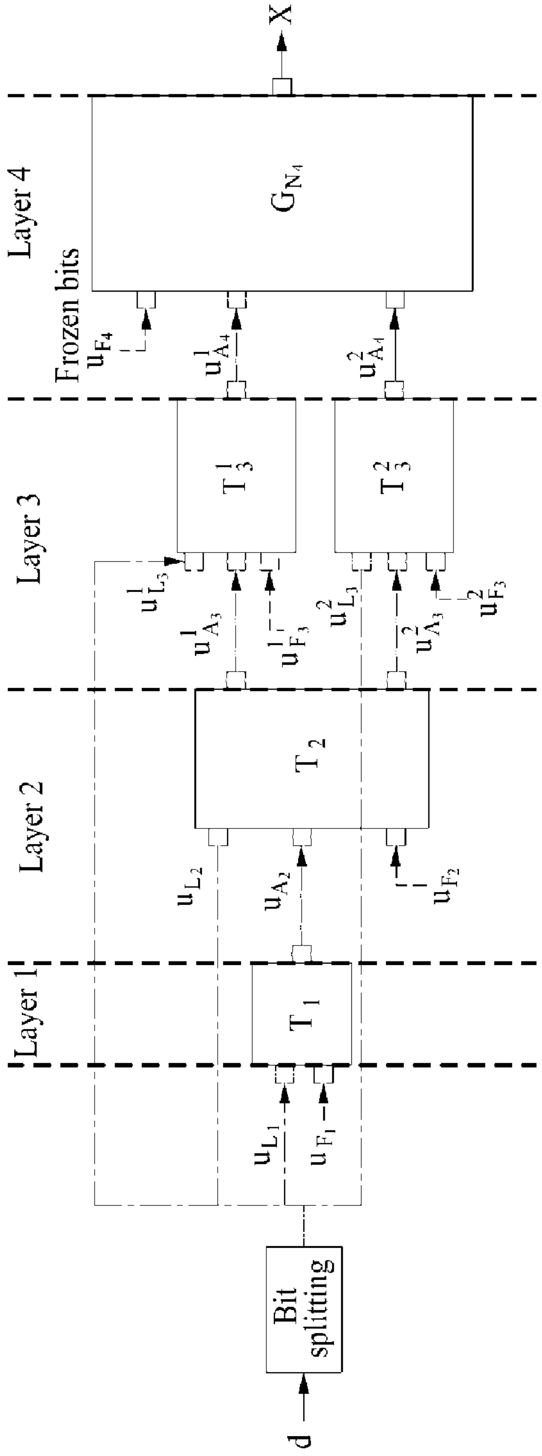
Figure 3F:
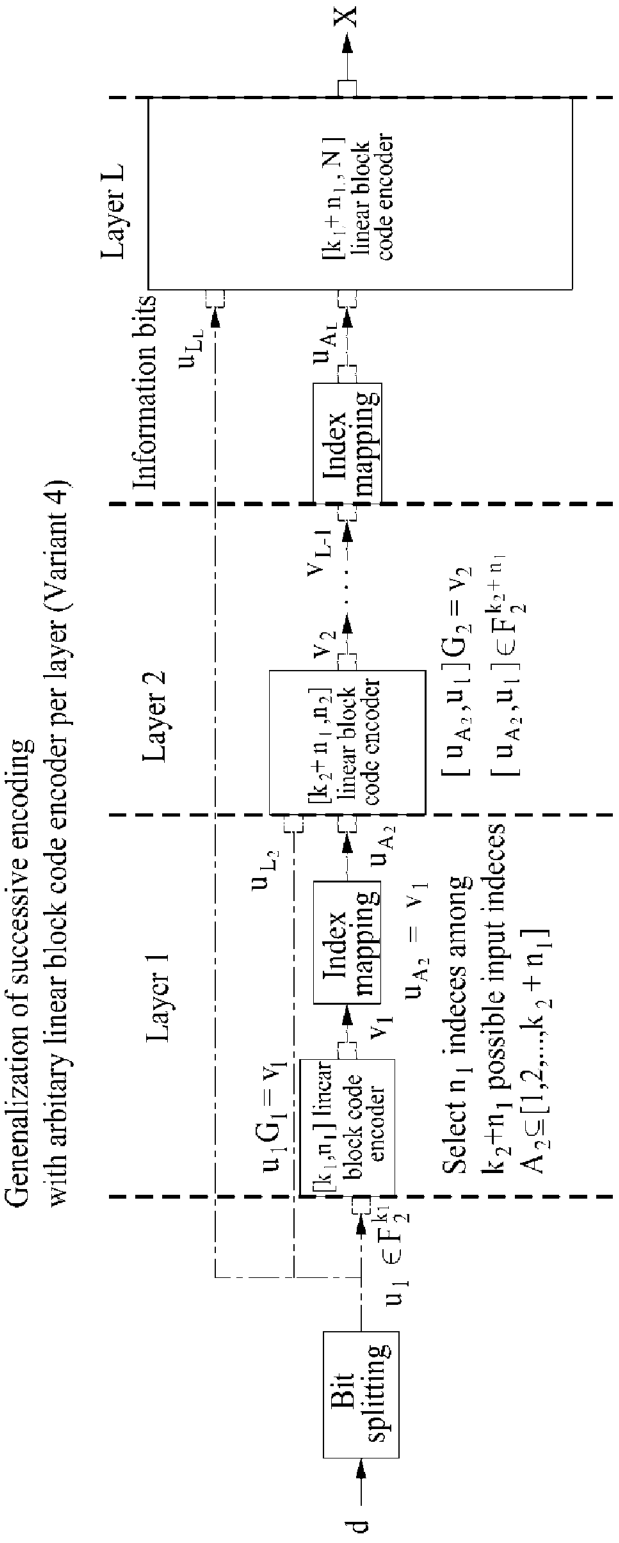
Figure 3G:
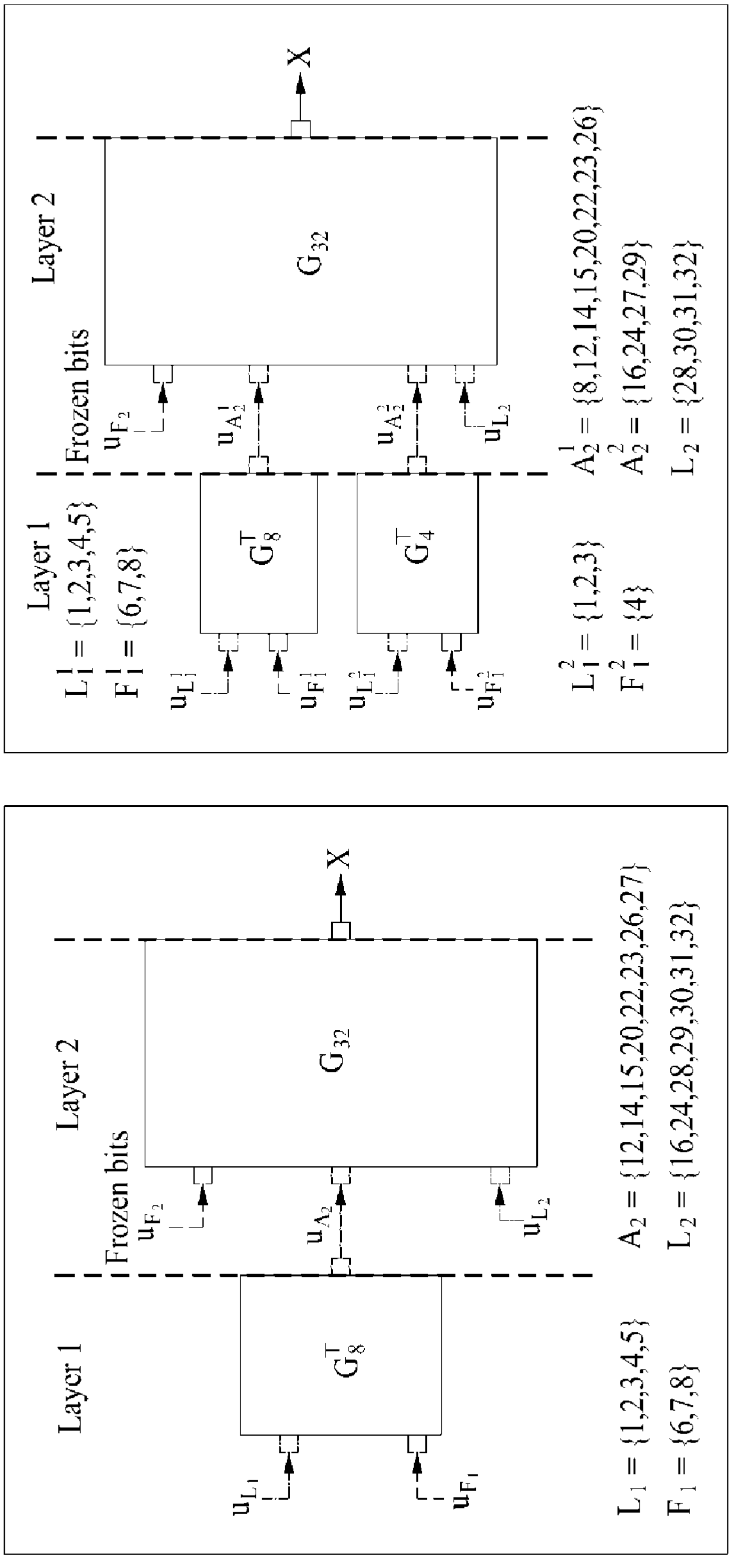

Also, a single polar kernel matrix may be connected to each of the plurality of layers as illustrated in FIG. 3B, and a plurality of polar kernel matrices may be connected to each of the plurality of layers as illustrated in FIG. 3G. That is, at least one polar kernel matrix may be connected to each of the plurality of layers.

An upper triangular matrix and a lower triangular matrix may be successively and alternately used for the polar kernel matrices respectively connected to the plurality of layers.

For example, a polar kernel matrix used as a preprocessing matrix in layer immediately preceding the bottom layer provided at the output end of the encoding device 100 among the plurality of layers may be an upper triangular matrix when the polar kernel matrix used in the bottom layer is a lower triangular matrix and may be the lower triangular matrix when the polar kernel matrix used in the bottom layer is the upper triangular matrix. In detail, for example, as illustrated in FIG. 3B, the (L-1)-th polar kernel matrix connected to the (L-1)-th layer (Layer L-1) may be the upper triangular matrix when the L-th polar kernel matrix connected to the L-th layer (Layer L) is the lower triangular matrix and may be the lower triangular matrix when the L-th polar kernel matrix connected to the L-th layer (Layer L) is the upper triangular matrix.

As another example, when the encoding device 100 includes two layers, a polar kernel matrix used as a preprocessing matrix in a layer immediately preceding the bottom layer provided at the output end of the encoding device 100 may be a partial upper triangular matrix when the polar kernel matrix used in the bottom layer is the lower triangular matrix and may be a partial lower triangular matrix when the polar kernel matrix used in the bottom layer is the upper triangular matrix.

The encoding device 100 as above may perform deep polar encoding by generating a codeword using a successive encoding method based on a linear or nonlinear function using a partial connection between the plurality of layers. However, the encoding device 100 may use not only a polar kernel matrix but also an existing linear block code generation matrix (e.g., low-density parity-check (LDPC), reed muller code, etc.) as an encoding matrix.

In terms of using the successive encoding method of using the partial connection between the plurality of layers, the encoding device 100 may generate a codeword with the successive encoding method of using cyclic redundancy check (CRC) precoding for at least some of information bits.

In detail, the encoding device 100 may generate a codeword with a successive encoding method of using at least one bit among an information bit, a connection bit, and a frozen bit as an input bit of encoding in each of the plurality of layers.

Here, the encoding device 100 may be configured such that input positions of the information bit, the input bit, and the frozen bit do not overlap.

As described above, since the successive encoding method of using at least one bit among the information bit, the connection bit, and the frozen bit as the input bit of encoding in each of the plurality of layers is used, a codeword output as an output value of encoding in each of the plurality of layers may be determined based on a polar kernel matrix used in each of the plurality of layers, the connection bit, and the information bit and may be used as an input of a connection bit of encoding in an immediately following layer. For example, a codeword used as an output value of encoding in the (L-1)-th layer (Layer L-1) may be used as an input of a connection bit of encoding in the L-th layer (Layer L) that is an immediately following layer.

If at least one polar kernel matrix is used in each of the plurality of layers (e.g., if the number of polar kernel matrices used in each of the plurality of layers is plural), codewords output as output values of encoding in each of the plurality of layers may be used as an input of multiple connection bits in the immediately following layer.

In particular, the encoding device 100 may use a weight as well as a bit channel. capacity of each of channels as a metric that considers performance of each of the channels. Hereinafter, the weight may be defined according to the number of specific binary data (e.g., binary data of “1”) on a bit generated by the polar kernel matrix used in each of the plurality of layers of the encoding device 100.

In detail, an input position of an information bit of encoding in each of the plurality of layers may be selected as a position at which a bit channel capacity is greater than or equal to a preset value based on a channel status and a polar kernel matrix used in each of the plurality of layers by the encoding device 100, and an input position of a connection bit of encoding in each of the plurality of layers may be selected as at least one position at which the bit channel capacity is greater than or equal to the preset value excluding a position at which the information bit is assigned among row positions at which a weight size of rows of the polar kernel matrix used in each of the plurality of layers by the encoding device 100 is greater than or equal to the preset value.

Here, the “preset value” that is a reference value to which the bit channel capacity is initially compared may be different from the “preset value” that is a reference value to which the weight size of rows is compared and may be the same as or different from the “preset value” that is a reference value to which the bit channel capacity is compared after the weight size is compared.

When retransmission is required in a communication environment, the encoding device 100 may retransmit at least some of output values of encoding in each of the plurality of layers. This is to use not only an output value of encoding previously received from the encoding device 100 but also an output value of encoding received again from the encoding device 100 when a decoding device 400, which is described below, performs decoding.

The encoding device 100 may include a determination unit 110 and a mapping unit 120 and may perform a code encoding method of operations S210 and S220 to perform the aforementioned encoding method.

In operation S210, the determination unit 110 may determine a first channel group connected to a lower encoding matrix and a second channel group connected to an upper encoding matrix and the lower encoding matrix among channels, based on a weight of each of polarized channels.

In the following, in the encoding device 100, an encoding matrix close to the input end is defined as the upper encoding matrix and an encoding matrix close to the output end is defined as the lower encoding matrix. Therefore, the upper encoding matrix and the lower encoding matrix may sequentially overlap, forming different layers as an output of the upper encoding matrix is connected to an input of the lower encoding matrix.

Also, the weight of each of the polarized channels may be defined according to the number of specific binary data (e.g., binary data of “1”) on a bit generated by each of the channels being polarized.

In detail, the determination unit 110 may determine, as the second channel group, at least one channel having the weight in the range of greater than or equal to a first value and less than a second value among the channels and may determine, as the first channel group, at least one remaining channel excluding the at least one channel determined as the second channel group among the channels.

Here, when determining the second channel group, the determination unit 110 may determine, as the second channel group, at least one channel having the same weight within the range of greater than or equal to the first value and less than the second value. For example, if each of channels 1, 2, and 3 has the weight within the range of greater than or equal to the first value and less than the second value and here, the weight of channel 1 and the weight of channel 2 are the same and the weight of channel 3 is different, the determination unit 110 may determine channels 1 and 2 having the same weight as the second channel group, excluding channel 3 having the different weight.

Also, when determining the second channel group, the determination unit 110 may consider the number of at least some codewords generated from information bits to be assigned to the channels included in the second channel group and at least some codewords generated from frozen bits to be assigned to the channels included in the second channel group.

For example, the determination unit 110 may determine at least one channel having the weight within the range of greater than or equal to the first value and less than the second value as the second channel group to correspond to the number of at least some codewords generated from information bits to be assigned to the channels included in the second channel group and at least some codewords generated from frozen bits to be assigned to the channels included in the second channel group.

In detail, for example, the determination unit 110 may determine, as the second channel group, the number of at least one channel that matches the number of at least some codewords generated from information bits to be assigned to the channels included in the second channel group and at least some codewords generated from frozen bits to be assigned to the channels included in the second channel group among channels having the weight within the range of greater than or equal to the first value and less than the second value and may exclude remaining channels.

In operation S220, the mapping unit 120 may generate codewords by mapping the information bits to the upper encoding matrix and the lower encoding matrix and may assign the generated codewords to the first channel group and the second channel group.

As described above, since the upper encoding matrix and the lower encoding matrix sequentially overlap, forming different layers, as the output of the upper encoding matrix is connected to the input of the lower encoding matrix, the mapping unit 120 may map the information bits at different depths for each channel group using the sequentially overlapping upper encoding matrix and lower encoding matrix.

Hereinafter, the depth represents the number of times polarization is performed by the lower encoding matrix and the upper encoding matrix.

In detail, in operation S220, the mapping unit 120 may map at least some bits of information bits to the lower encoding matrix such that at least some codewords generated from at least some bits of the information bits are assigned to at least one channel having a weight of greater than or equal to the second value among channels included in the first channel group, may map at least some frozen bits to the lower encoding matrix such that at least some codewords generated from at least some bits of the frozen bits are assigned to at least one channel having a weight of less than the first value among the channels included in the first channel group, and may sequentially map at least some remaining bits of the information bits and at least some remaining bits of the frozen bits to the upper encoding matrix and the lower encoding matrix such that at least some codewords generated from at least some remaining bits of the information bits and at least some codewords generated from at least some remaining bits of the frozen bits are assigned to the channels included in the second channel group.

An encoding method in a structure that includes layer 1 corresponding to the upper encoding matrix and layer 2 corresponding to the lower encoding matrix is described above. However, even in a structure in which the number of upper encoding matrices and lower encoding matrices are implemented to be plural and the number of sets of the upper encoding matrix and the lower encoding matrix is implemented to be plural, the aforementioned encoding method may be repeatedly performed to a plurality of sets while being performed to a set of the upper encoding matrix and the lower encoding matrix. Since a plurality of lower encoding matrices and a plurality of upper encoding matrices are implemented, the determination unit 110 and the mapping unit 120 may repeatedly operate.

A structure of the encoding device 100 according to an example embodiment will be further described with reference to FIGS. 3A to 3G.

FIGS. 3A to 3G illustrate examples of a structure of an encoding device based on improved deep polarization according to an example embodiment. The encoding device 100 described with reference to FIGS. 1 and 2 may be implemented to have the structure of FIGS. 3A to 3G.

Referring to FIG. 3A, the determination unit 110 may determine polarized channels ($W_2$, $W_3$) each having a weight within the range of greater than or equal to a first value and less than a second value among channels ($W_1$, $W_2$, $W_3$, $W_4$) as a second channel group connected to overlapping encoding matrices (lower encoding matrix ($G_4$) and upper encoding matrix ($G_2$)) and may determine remaining channels ($W_1$, $W_4$) as a first channel group connected to the lower encoding matrix ($G_4$).

The mapping unit 120 may generate a codeword ($X_4$) by mapping some information bits, for example, an information bit ($U_4$), of information bits ($V_2$, $U_4$) to the lower encoding matrix ($G_4$) and then may assign the generated codeword ($X_4$) to the channel ($W_4$) having the weight of greater than or equal to the second value between the channels ($W_1$, $W_4$) included in the first channel group.

Also, the mapping unit 120 may generate a codeword ($X_1$) by mapping some frozen bits, for example, a frozen bit ($U_1$), of frozen bits ($U_1$, $V_1$) to the lower encoding matrix ($G_4$) and then may assign the generated codeword ($X_1$) to the channel ($W_1$) having the weight of less than the first value between the channels ($W_1$, $W_4$) included in the first channel group.

Also, the mapping unit 120 may generate codewords by mapping a remaining information bit ($V_2$) of the information bits ($V_2$, $U_4$) and a remaining frozen bit ($V_1$) of the frozen bits ($U_1$, $V_1$) to the upper encoding matrix ($G_2$) and by mapping bits ($U_2$, $U_3$) output as a result thereof to the lower encoding matrix ($G_4$) and then may sequentially assign the generated codewords ($X_2$, $X_3$) to the channels ($W_2$, $W_3$) included in the second channel group.

Although the encoding method according to an example embodiment is described as an example applied when a blocklength is 4, the encoding method may be applied equally when the blocklength is $2^n$ that is 4 or more.

Hereinafter, the encoding method of the encoding device 100 according to an example embodiment is described based on deep polar codes, a family of pre-transformed polar codes.

I. Deep Polar Codes

A. Encoding $$A(N, K, \{\mathcal{J}_\ell\}_{\ell=1}^{L}, \{\mathcal{A}_\ell\}_{\ell=1}^{L}, \{T_\ell\}_{\ell=1}^{L})$$

deep polar code is defined with the following parameters:

i) L transformation matrices $$T_\ell \in \mathbb{F}_2^{N_\ell \times N_\ell}$$

ii) L information sets $\{\mathcal{I}_1, \mathcal{I}_2, \ldots, \mathcal{I}_L\}$ iii) L connection sets $\{\mathcal{A}_1, \mathcal{A}_2, \ldots, \mathcal{A}_L\}$ For the parameters, a deep polar encoder (hereinafter, the deep polar encoder or an encoder represents the encoding device 100 of FIG. 1) performs information bit splitting and successive encoding.

Information bit splitting and mapping: Information vector $$d \in \mathbb{F}_2^K$$

that transmits K information bits is split into L information sub-vectors $d\ell$, each with a size of $$K_\ell = |\mathcal{J}_\ell|(<N_\ell) \text{ for } \ell \in [L] \text{ and } \sum_{\ell=1}^{L} K_\ell = K.$$

Let $$u_\ell = [u_{\ell,1}, u_{\ell,2}, \ldots, u_{\ell,N_\ell}] \in \mathbb{F}_2^{N_\ell}$$

be an input vector of layer $\ell$ with a length of $N_\ell$ for $\ell \in [L]$. An index set of the $\ell$-th layer is partitioned into three nonoverlapping sub-index sets as below.

$$[N_\ell] = \mathcal{J}_\ell \cup \mathcal{A}_\ell \cup \mathcal{F}_\ell, \quad \text{< Equation 1 >}$$

Here, $\mathcal{F}_\ell = [N_\ell]/\{\mathcal{J}_\ell \cup \mathcal{A}_\ell\}$ denotes a frozen bit set of layer $\ell$ and $\mathcal{J}_\ell \cap \mathcal{A}_\ell = \emptyset$. The information vector of the $\ell$-th layer, $$d_\ell \in \mathbb{F}_2^{K_\ell},$$

is assigned to $u_{\mathcal{J}_\ell}$. Meanwhile, the frozen bits are assigned to $u_{\mathcal{F}_\ell}=0$. Here, $\mathcal{F}_\ell = [N_\ell]/\{\mathcal{J}_\ell \cup \mathcal{A}_\ell\}$.

Successive encoding: As illustrated in FIG. 3B, an L-layered deep polar code is constructed by an L-layered successive encoding procedure. Let $$T_\ell \in \mathbb{F}_2^{N_\ell \times N_\ell}$$

be an $\ell$-th layered pre-transformation matrix in which $N_1 < N_2 < \ldots < N_{L-1} < N_L$. Unlike polarization-adjusted convolutional (PAC) or other PAC-like codes, the proposed deep polar code adopts a pre-transformation matrix by multiplying transpose of the polar transformation matrix with a length of $N_\ell = 2^{n_\ell}$ for $n_\ell \in Z+$ as follows.

$$T_\ell = G_{N_\ell}^T \quad \text{< Equation 2 >}$$

The transpose matrix of $G_{N_\ell}$ has an upper triangular matrix structure. As far as the upper triangular matrix structure having not 0 but a diagonal component is maintained, all pre-transformation matrices $T_\ell$ may be used.

In a first layer, the encoder generates an input vector of first layer encoding, $$u_1 = [u_{\mathcal{J}_1}, u_{\mathcal{F}_1}].$$

Here, $A_1 = \phi$. An encoder output of the first layer is generated by $$G_{N_1}^T$$

as follows.

$$v_1 = u_1 G_{N_1}^T \quad \text{< Equation 3 >}$$

In a second layer, an output vector of first layer encoding is assigned to an input of the second layer to a connection index set $A_2$, i.e., $$u_{\mathcal{A}_2} = v_1.$$

Since $$u_{\mathcal{J}_2} = d_2 \text{ and } u_{\mathcal{F}_2} = 0,$$

an input vector of second layer encoding is generated as follows.

$$u_2 = [u_{\mathcal{J}_2}, u_{\mathcal{A}_2}, u_{\mathcal{F}_2}] \quad \text{(Equation 4)}$$

By multiplying $u_2$ with $$G_{N_2}^T,$$

an output vector of second layer encoding is obtained as follows.

$$v_2 = u_2 G_{N_2}^T \quad \text{(Equation 5)}$$

Similar to the second layer encoding, an $\ell$-th layer encoder for $2 < \ell \leq L$ takes the input vector.

$$u_\ell = [u_{\mathcal{J}_\ell}, u_{\mathcal{A}_\ell}, u_{\mathcal{F}_\ell}] \quad \text{(Equation 6)}$$

Here, $$u_{\mathcal{A}_\ell} = u_{\ell-1} G_{N_{\ell-1}}^T$$

and a corresponding output vector is generated by multiplying $$G_{N_\ell}^T$$

as follows.

$$v_\ell = u_\ell G_{N_\ell}^T \quad \text{(Equation 7)}$$

For notational simplicity, an output of a last layer encoder is denoted as channel input $$x = v_L \in \mathbb{F}_2^{N_\ell}.$$

B. Rate-Profiling

An error-correcting performance of the deep polar code is determined according to a selection of information and connection sets in all layers ($\mathcal{I}_\ell$ and $\mathcal{A}_\ell$). Therefore, the encoding device 100 according to an example embodiment may employ an efficient rate-profiling method that may achieve superior coding performance with flexible decoding complexity. The rate-profiling method is to construct $\mathcal{I}_\ell$ and $\mathcal{A}_\ell$ individually across the entre layers and carefully connect the layers.

Selection of $\mathcal{I}_\ell$ and $\mathcal{A}_\ell$: A method of selecting information and connection sets for the $\ell$-th layer for $\ell \in \{1, \ldots, L\}$ is described. To construct $\mathcal{I}_\ell$ and $A_\ell$ independently over the layers, it is assumed that a channel input $x_\ell \in \{0, 1\}^{N_\ell}$ is formed by the transpose of polar transformation $$x_\ell = u_\ell G_{N_\ell}^T \text{ for } \ell \in \{1, 2, \ldots, L-1\} \text{ and } x_L = u_L G_{N_L}^T.$$

This input vector is transmitted through B-DMC, W: x→y, which generates a channel output $y_\ell$. Then, an i-th bit-channel $$W_{N_\ell}^{(i)}: x \to y^{N_\ell} \times x^{i-1} \text{ (here, } i \in [N_\ell])$$

is defined as follows.

$$W_{N_\ell}^{(i)}(y_\ell, u_{\ell,1:i-1} \mid u_{\ell,i}) = \sum_{u_{\ell,i+1:N} \in \mathbb{F}_2^{N_\ell - i}} \frac{1}{2^{N-i}} W^{N_\ell}(y_\ell \mid x_\ell) \quad \text{⟨Equation 8⟩}$$

Here, $u_{\ell,a:b}=[u_{\ell,a}, u_{\ell,a+1} \ldots, u_{\ell,b}]$ for a, b$\in N_\ell$ and a<b and $$I\left(W_{N_\ell}^{(i)}\right)$$

denotes an i-th bit-channel capacity.

To construct $\mathcal{I}_\ell$ and $\mathcal{A}_\ell$, an index set $R_\ell$ is initially defined according to RM rate-profiling by selecting i$\in[N_\ell]$ such that the weight of rows $G_{N_\ell}$ is greater than or equal to $$d_\ell^{min}.$$

$$\mathcal{R}_\ell = \left\{i \in [N_\ell]: wt\left(g_{N_{\ell,i}}\right) \geq d_\ell^{min}\right\} \quad \text{⟨Equation 9⟩}$$

Here, $$d_\ell^{min}$$

denotes a target minimum distance for $\ell$-th layer encoding. Then, an ordered index set of $R_\ell$ is defined as follows.

$$\overline{\mathcal{R}_\ell} = \left\{i_1, i_2, \ldots, i_{|\mathcal{R}_\ell|}\right\} \quad \text{⟨Equation 10⟩}$$

Here, $i_1$ denotes an index of a most reliable synthetic channel, that is, $$I\left(W_{N_\ell}^{(i_1)}\right) \geq I\left(W_{N_\ell}^{(i_2)}\right) \geq \ldots \geq I\left(W_{N_\ell}^{(i_{|\mathcal{R}_\ell|})}\right).$$

This ordered set may be constructed using indices of Bhattacharyya values, that is, $$Z\left(W_{N_\ell}^{(i_1)}\right) \leq Z\left(W_{N_\ell}^{(i_2)}\right) \ldots \leq Z\left(W_{N_\ell}^{(i_{|\mathcal{B}_\ell|})}\right).$$

Using the ordered index set, the information set $\mathcal{I}_\ell$ is generated by selecting bit-channel indices that are approximately polarized to capacity of one for given code length $N_\ell$.

$$\mathcal{I}_\ell = \left\{i \in \overline{\mathcal{R}_\ell}: I\left(W_{N_\ell}^{(i)}\right) \geq 1 - \delta_\ell\right\} \quad \text{<Equation 11>}$$

Here, $\delta_\ell > 0$ is selected as an arbitrary small value and $|\mathcal{I}_\ell| = K_\ell$.

Then, the connection set $\mathcal{A}_\ell$ is constructed as a subset of $R_\ell / \mathcal{I}_\ell$. With the assumption that $$i_1, i_2, \ldots, i_{N_{\ell-1}} \in R_\ell / \mathcal{I}_\ell$$

are indices that provide a highest $N_{\ell-1}$ bit-channel capacity in $R_\ell / \mathcal{I}_\ell$ such that $$I\left(W_{N_\ell}^{(i_1)}\right) \geq I\left(W_{N_\ell}^{(i_2)}\right) \geq \ldots \geq I\left(W_{N_\ell}^{(i_{N_{\ell-1}})}\right),$$

the connection set $\mathcal{A}_\ell$ is represented as follows.

$$\mathcal{A}_\ell = \left\{i_1, i_2, \ldots, i_{N_{\ell-1}}\right\} \quad \text{<Equation 12>}$$

A frozen set of layer $\ell$ is defined as a collection of indices that are excluded in both the information set and the connection set as follows.

$$\mathcal{F}_\ell = [N_\ell] / \{\mathcal{I}_\ell \cup \mathcal{A}_\ell\} \quad \text{<Equation 13>}$$

The deep polar codeword generated by the proposed information and layer-by-layer connection sets may ensure a minimum distance of $$d_\ell^{min}.$$

C. Remarks

Encoding complexity: The deep polar code may be regarded as a normalized version of standard polar codes. The standard polar code may be regarded as the deep polar code having a single layer in which a null connection is set. Also, the deep polar code operates as an alternative form of a pre-transformed polar code that includes a PAC code.

The encoding complexity of $\ell$-th layer is $O(N_\ell \log_2 N_\ell)$. Therefore, the total encoding complexity may be expressed as follows.

$$O\left(\sum_{\ell=1}^{L} N_\ell \log_2 N_\ell\right) \quad \text{〈Equation 14〉}$$

When $N_L$ is sufficiently larger than $N_\ell$ for $\ell \in [L-1]$, the encoding complexity may be comparable to that of the standard polar codes. Selecting a small size of $N_\ell$ for $\ell \in [L-1]$ is a practical and effective strategy for reducing the encoding complexity.

Construction of flexible connection set: When a size of $\mathcal{A}_\ell$ differs from $2^{N_\ell}$, a pre-transformation matrix of the $\ell$-th layer may be constructed as a partial matrix of $$G_{N_\ell}^{T}$$

by selecting a column to provide additional flexibility in layer connection. This construction improves adaptability of layer connection of a system.

Superposition codes: The deep polar code is generated using L-th layered polar transformation in which an input vector $u_L$ includes $$u_{\mathcal{I}_\ell}, u_{\mathcal{A}_\ell}, u_{\mathcal{F}_\ell}.$$

Consequently, the deep polar code may be represented as superposition of two sub-codewords as follows.

$$x = \underbrace{\sum_{j\in\mathcal{I}_L} u_{\ell,j} g_{N_L,j}}_{x_P} + \underbrace{\sum_{i\in\mathcal{A}_L} u_{\ell,i} g_{N_L,i}}_{x_{TP}} \quad \text{〈Equation 15〉}$$

Meanwhile, first term $$x_P = \sum\nolimits_{j\in\mathcal{I}_L} u_{\ell,j} g_{N_L,j} = u_{\mathcal{I}_L} G_{N_L,\mathcal{I}_L}$$

forms a polar code. Meanwhile, second term $$x_{TP} = \sum\nolimits_{i\in\mathcal{A}_L} u_{\ell,i} g_{N_L,i} = u_{\mathcal{A}_L} G_{N_L,\mathcal{A}_L}$$

generates a polar code transformed to multiple layers. Consequently, the deep polar code may be understood as a combination of the polar code and a supposition code with the transformed polar code.

Minimum distance of deep polar code: The minimum distance of the deep polar codes is greater than or equal to a minimum distance of layer L, $$d_L^{min}.$$

By the construction, the encoder selects row vectors of $G_{NL}$ with respect to all of information and connection sets with the weight by the construction greater than $$d_L^{min}.$$

That is, for $j \in \mathcal{I}_L \cup \mathcal{A}_L$, it is expressed as follows.

$$wt(g_{N_L,j}) \geq d_L^{min} \quad \text{<Equation 16>}$$

Since a transformation matrix has an upper triangular structure, transformed sub-codewords $$x_{TP} = \sum\nolimits_{i\in\mathcal{A}_L} u_{\ell,i} g_{N_L,i}$$

are ensured to maintain at least $$d_L^{min}.$$

Weight spectrum improvement: Similar to other pre-transformed polar codes, the deep polar code has an improved weight spectrum compared to the existing polar codes since sub-codewords $x_{TP}$ are generated through partial pre-transformation.

Cyclic redundancy check (CRC)-aided deep polar codes: One possible extension of deep polar codes is to concatenate them with CRC codes. In this approach, precoding of K-bit information vector d is performed using CRC generator polynomials and adds CRC bits. The length of resulting information sequence becomes $K+K_{CRC}$. Here, $K_{CRC}$ denotes the number of CRC bits. Also, short CRC bits may be added to $$u_{\mathcal{I}_\ell}$$

to improve decoding performance.

II. Examples

In this section, provided are some examples of deep polar codes in a short blocklength regime to better understand the proposed encoding method. Throughout this section, focus is made on a short packet transmission scenario with a length of 32 over BEC with an erasure probability of 0.5, that is, I(W)=0.5 at three different rates $$\left\{\frac{11}{32}, \frac{15}{32}\right\}.$$

A. Channel Polarization and Row Weight of $G_{32}$

Figure 7:
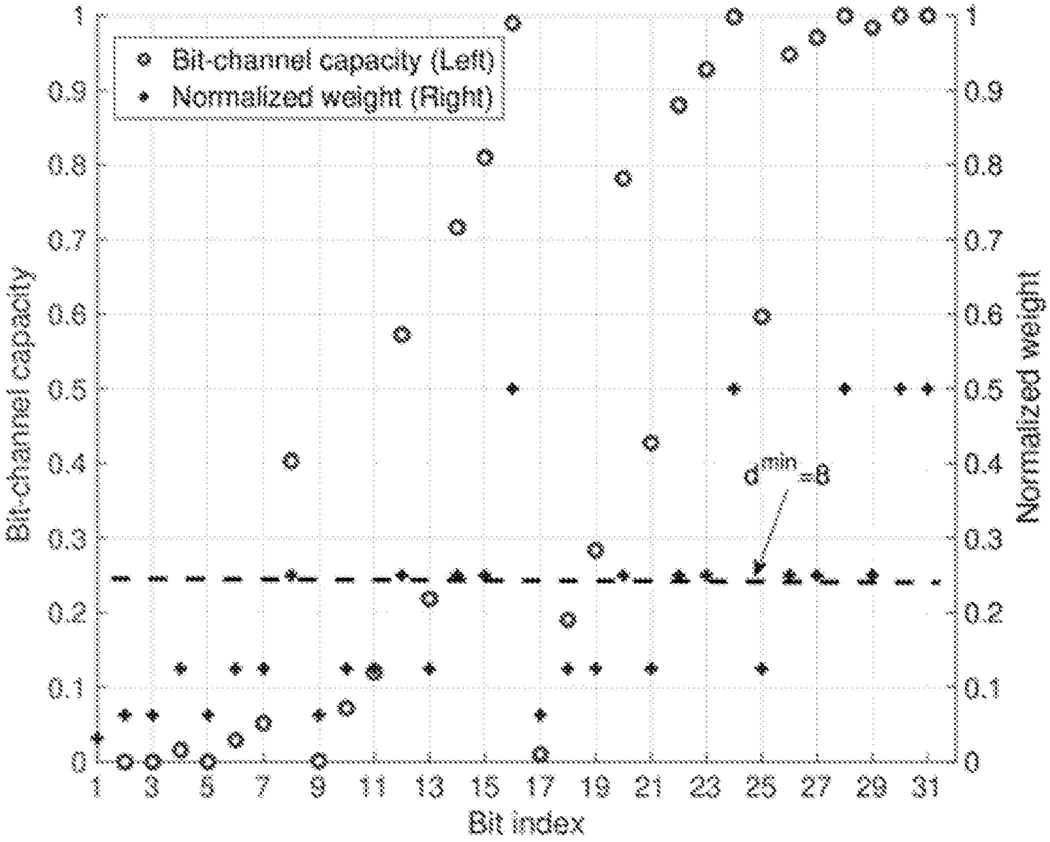
FIG. 7 represents bit-channel capacity for BEC.

For a deep polar code construction, it is important to understand the polarization bit-channel capacity and row weight of $G_{32}$. As shown in FIG. 7, circles represent bit-channel capacity for BEC with $$I(W) = 0.5., \text{ i.e., } I\left(W_{32}^{(i)}\right)$$

for $i \in [32]$. The cross denotes a normalized weight of $G_{32}$ according to index $i \in [32]$, i.e., $$\frac{\text{wt}(g_{32,i})}{32}.$$

Ordered index sets are mismatched according to bit-channel capacity and normalized weights. For example, $$I\left(W_{32}^{(25)}\right) > I\left(W_{32}^{(12)}\right)$$

but $$\frac{\text{wt}(g_{32,25})}{32} < \frac{\text{wt}(g_{32,12})}{32}.$$

Accordingly, when including bit-index 25 in information that is set according to polar rate-profiling to facilitate SC decoding, the minimum distance of codewords is reduced. To improve superior coding performance, the bit index needs to be selected in consideration of all the weight and the bandwidth capacity. Rate-profiling of polar codes uses this strategy with sequential pre-transformation between layers.

B. Example 1

(32, 11, $\mathcal{I}_1$, $\mathcal{I}_2$, $\mathcal{A}_2$, $G_8$, $G_{32}$) deep polar code is constructed using two transformation matrices, i.e., $$G_8^T$$

for layer 1 and $G_{32}$ for layer 2. Here, a code rate is $$R = \frac{11}{32}.$$

To construct the deep polar codeword using $$G_8^T$$

and $G_{32}$, information sets for layer 1, $\mathcal{I}_1$, and layer 2, $\mathcal{I}_2$, and a set that connects between layers $A_2$ need to be defined. For a minimum target distance of the second layer, $$d_2^{min} = 8,$$

set $R_2$ may be generated by collecting indices of rows in $G_{32}$ of which weights are greater than or equal to $$d_2^{min} = 8.$$

That is, $\mathcal{R}_2$={8, 12, 14, 15, 16, 20, 22, 23, 24, 26, 27, 28, 29, 30, 31, 32}.

From bit-channel capacity $$I\left(W_{32}^{(i)}\right)$$

for $i \in R_2$, information set for the second layer is selected as follows.

$$\mathcal{I}_2 = \left\{i \in [32]: I\left(W_{32}^{(i)}\right) \geq 0.98\right\} = \{32, 31, 30, 28, 24, 16, 29\}$$

Here, $|\mathcal{I}_2|=K_2=7$. Since $N_1=8$, a connection set for the second layer is obtained by collecting eight bit-channel indices that provide highest capacity as follows.

$\mathcal{A}_2 = \mathcal{R}_2 / \mathcal{I}_2$={26, 27, 23, 22, 15, 20, 14, 12}

It is worth mentioning that bit-channel index 25 is excluded in the connection set although the capacity of bit-channel index 25 is greater than the capacity of index 12, that is, $$I\left(W_{32}^{(25)}\right) \geq I\left(W_{32}^{(12)}\right).$$

This is because $\text{wt}(g_{32,25})=4<\text{wt}(g_{32,12})=8$. A frozen set of the second layer is $\mathcal{F}_2$={1, 2, . . . , 32}/{$\mathcal{I}_2 \cup \mathcal{A}_2$}.

In the first layer, four indices that yield highest bit-channel capacity using the polar transformation matrix $G_8$ are selected, while ensuring $$d_2^{min} \geq 4.$$

The corresponding information and frozen sets are selected as $\mathcal{I}_1$={1, 2, 3, 5} and $\mathcal{F}_1$={8, 7, 6, 4}, respectively. Then, an output vector of the first layer, $$v_1 = u_1 G_8^T,$$

is connected to an input of the connection set $$u_{\mathcal{A}_2} = v_1.$$

C. Example 2

Provided is another example that constructs $$\left(32, 11, \mathcal{J}_1, \mathcal{J}_2, \mathcal{A}_2, G_4^T, G_{32}\right)$$

deep polar code of which a code rate is $$R = \frac{15}{32}$$

in the same BEC channel with I(W)=0.5. Similar to Example 1, indices corresponding to row vectors of $G_{32}$ with a weight of greater than 8 are selected in an identical manner as $R_2$={8, 12, 14, 15, 16, 20, 22, 23, 24, 26, 27, 28, 29, 30, 31, 32}.

Using a deep polar rate-profiling method, information and connection sets are selected as $\mathcal{J}_2$={15, 16, 22, 23, 24, 26, 27, 28, 29, 30, 31, 32} with $K_2=|\mathcal{J}_2|=12$ and $\mathcal{A}_2$={8, 12, 14, 20}. Then, the information set for the first layer is selected as $\mathcal{J}_1$={1, 2, 3} with $K_1=|\mathcal{J}_2|=3$.

D. Comparisons with RM-Type and Polar Codes

Deep polar codes in Example 1 and Example 2 are compared to the existing RM and polar codes. For fair comparison, polar codes are generated by selecting top Kε{11, 15} bit-channel indices that provide the highest capacity. For RM code construction with information bit size K∈{11, 15}, a sub-codeword set of [32, 16] RM code is considered. Since an information set of the [32, 16] RM code is given as the following Equation 17, an information set for K=15 is selected as a subset of $$\mathcal{J}_{RM}^{16} =, \text{ that is, } \mathcal{J}_{RM}^{15} \subseteq \mathcal{J}_{RM}^{16}.$$

In particular, to optimize the code performance, weight distributions of 16 possible sub-codebooks of the [32, 16] RM code are evaluated and one having the smallest number of codewords with the minimum weight is selected.

$$\mathcal{J}_{RM}^{16} = \{i : wt(g_{32,i}) \geq 8\} \quad \langle\text{Equation 17}\rangle$$

Weight distribution: As shown in the following Table 1, the proposed deep polar codes provide superior weight distributions than those of the RM and polar codes in both code rates. In particular, the deep polar code has fewer codewords having a minimum weight than the RM code while maintaining the same minimum distance of 8 in both code rates. Also, the [32,15] deep polar code may improve both the minimum distance and the number of codewords having the smallest weight.

TABLE 1

COMPARISON OF THE WEIGHT DISTRIBUTIONS

| | [32, 11] | | | [32, 16] | | |
|---|---|---|---|---|---|---|
| Weight | Polar | RM-type | Proposed | Polar | RM-type | Proposed |
| 0 | 1 | 1 | 1 | 1 | 1 | 1 |
| 4 | 0 | 0 | 0 | 8 | 0 | 0 |
| 8 | 76 | 52 | 20 | 444 | 364 | 300 |
| 12 | 192 | 288 | 416 | 6328 | 6720 | 6976 |
| 16 | 1510 | 1366 | 1174 | 19206 | 18598 | 18214 |
| 20 | 192 | 288 | 416 | 6328 | 6720 | 6976 |
| 24 | 76 | 52 | 20 | 444 | 364 | 300 |
| 28 | 0 | 0 | 0 | 8 | 0 | 0 |
| 32 | 1 | 1 | 1 | 1 | 1 | 1 |

Figure 8:
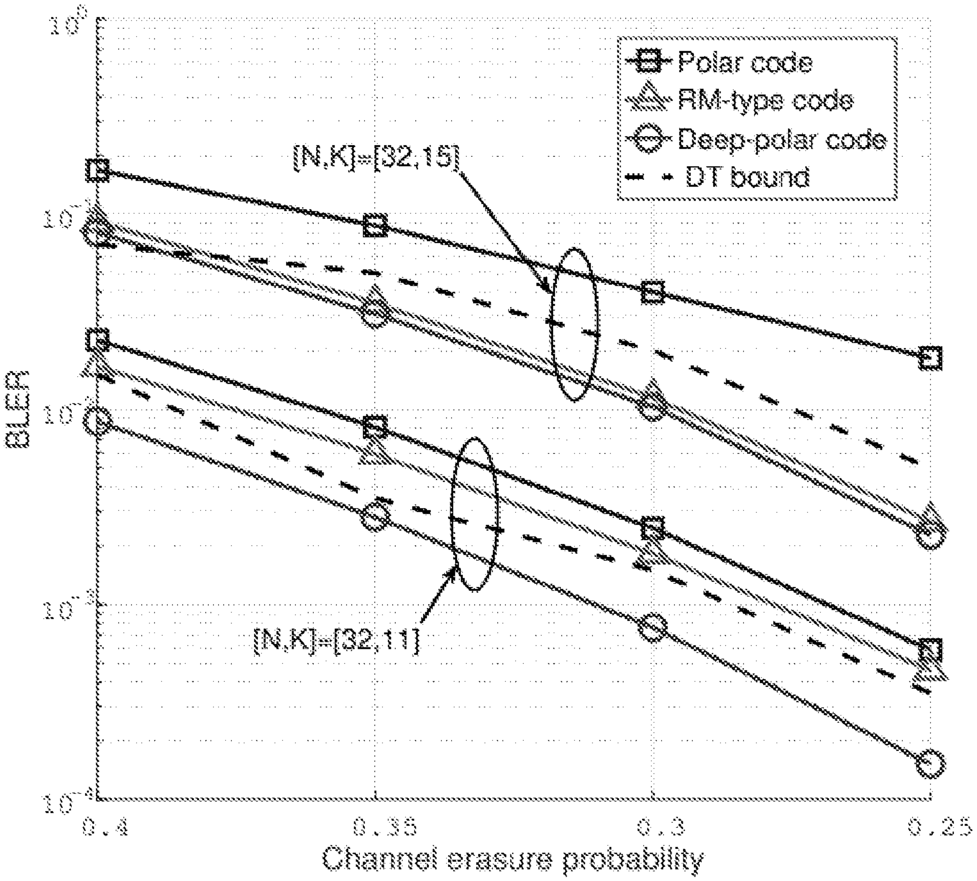
FIG. 8 shows noticeable BLER improvement compared to the RM and polar codes when K=11.

Block error rate (BLER) performance: To demonstrate the effect of weight distribution improvement in code design, frame error rates (FERs) for three channels are displayed under maximum likelihood (ML) decoding while increasing an erasure probability of BEC. As shown in FIG. 8, the proposed deep polar provides noticeable BLER improvement compared to the RM and polar codes when K=11. Such BLER gain is obtained due to considerable reduction of codewords with the minimum weight. When K=15, a minimum distance of deep polar and RM codes is greater than the polar code, which leads to improving the BELR performance. In this case, although the deep polar code and the RM code have the same minimum distance, the number of codewords with the minimum weight decreases as shown in the above Table 1 and accordingly, the deep polar code slightly outperforms the RM code.

One remarkable result is that the deep polar code may achieve better BLER performance than a dependence-testing (DT) bound that is one of strongest achievability bounds for BEC in a finite blocklength regime. The result shows that the deep polar code has the potential capable of achieving capacity of BEC at small intervals in the short blocklength regime having various code rates.

Pre-transformation using a sub-upper triangular matrix: In contrast to conventional pre-transformed polar codes that use an upper triangular matrix for pre-transformation, the proposed encoding structure introduces an outstanding approach. The resulting transformation matrix across a plurality of layers may be seen as a sub-matrix of the upper triangular matrix. As shown in the aforementioned example, a two-layered encoding structure may be expressed with a unified pre-transformation matrix $$T \in \mathbb{F}_2^{32\times 32},$$

as follows.

$$[u_{\mathcal{F}_2}, u_1, u_{\mathcal{J}_2}] \underbrace{\begin{bmatrix} 0_{17} & 0_{17} & 0_{17} \\ 0_8 & G_8^T & 0_8 \\ 0_7 & 0_7 & I_7 \end{bmatrix}}_{T} G_{32} = x \quad \langle\text{Equation 18}\rangle$$

It is evident that the resulting pre-transformed matrix T does not exhibit an upper diagonal structure. Instead, a sub-matrix of T takes a form of the upper triangular matrix. This condition is less strict than the existing pre-transformed code in which the entire T matrix needs to be upper triangular.

III. Normalized Deep Polar Code

In this section, presented is an improved deep polar encoding method based on the previous construction technology. In the previous approach, an encoder of each layer uses a single pre-transformation matrix. Although this encoding method is simple, the limitation of using only a single pre-transformation matrix for each layer limits the flexibility of code design. This basic deep polar code construction method is referred to as Construction A.

To improve the flexibility of deep polar code design, a novel approach called a normalized successive encoding method for deep polar code is introduced. The key concept of this method uses a plurality of pre-transformation matrices for each encoding layer. A size of a multi-pre-transformation matrix may differ. This technology is differentiated from Construction A by improving adaptability and user definition in the code design. This advanced construction method is called Construction B. Construction B provides significantly improved functions compared to original Construction A using power of a plurality of pre-transformation matrices in each encoding layer, which provides a more versatile and adaptable framework for the deep polar code design.

A. Encoding—Construction B

Some notations are defined as follows:

i) Let $$\mathcal{I}_\ell^j \text{ and } \mathcal{A}_\ell^j$$

be j-th information and connection sets of layer $\ell$. Here, $\ell \in [L]$ and $j \in [J_\ell]$.

ii) Let $$u_{\mathcal{I}_\ell^j} \text{ and } u_{\mathcal{A}_\ell^j}$$

be j-th information and connection bits of layer $\ell$.

iii) Let $$T_\ell^j$$

be a j-th encoding matrix of layer $\ell$.

iv) Let $$v_\ell^j$$

be a j-th encoder output of layer $\ell$.

An encoding process is a sequential operation. The difference lies in that a plurality of pre-transformation matrices may be used for each layer and a size of each pre-transformation matrix may be different.

Step 1: A j-th encoder output vector in layer $\ell$ is generated as follows.

$$v_\ell^j = \left[u_{\mathcal{F}_\ell^j}, u_{\mathcal{A}_\ell^j}, u_{\mathcal{I}_\ell^j}\right]T_\ell^j \qquad \text{< Equation 19 >}$$

Step 2: A j-th output vector of layer $\ell$ is assigned to a j-th connection bit of layer $\ell+1$ as follows.

$$u_{\mathcal{A}_{\ell+1}^j} := v_\ell^j \qquad \text{< Equation 20 >}$$

The encoder performs encoding by repeatedly using Step 1 and Step 2 until last layer L is reached.

The deep polar encoder may have the structure illustrated in FIGS. 3B to 3G. In detail, FIG. 3E shows a normalized deep polar encoder with L=4. In contrast to Construction A, an encoder output $v_2$ of layer 2 is split into two separate components, $$v_2^1 \text{ and } v_2^2.$$

Then, the components are mapped to layer 3 and two connection vectors of $$u_{\mathcal{A}_3^1} \text{ and } u_{\mathcal{A}_3^2}.$$

The connection vectors serve as partial input for a layer 3 encoding process.

In layer 3, two pre-transformation matrices, $$T_3^1 \text{ and } T_3^2,$$

are used in parallel. Sizes thereof may differ. Each connection vector $$u_{\mathcal{A}_3^j}$$

generates $$v_3^j$$

by constructing an input vector of encoder $$T_3^j$$

through combination of $$u_{\mathcal{I}_3^j} \text{ and } u_{\mathcal{F}_3^j}.$$

A final layer encoder uses $$u_{\mathcal{A}_4^j} := v_3^j$$

and generates a final codeword x using $$T_4 = G_{N_4}.$$

B. Effect of Encoder Normalization

To explain two different construction methods, an example of focusing on [32, 12] deep polar codes is presented and weight distributions and BELR performance are compared.

Construction A: FIG. 3G provides visual representation of Construction A that uses a single pre-transformation matrix for each layer. FIG. 3G illustrates information and frozen sets for each layer.

Construction B: In Construction B that is an alternative approach, two pre-transformation matrices are used to generate two separate connection bits between a first layer and a second layer. Sizes of two pre-transformation matrices may be
different. Accordingly, $$\mathcal{A}_1^1 \cup \mathcal{A}_1^2$$

that is a resulting connection set size is not necessarily a power of 2. This construction provides greater freedom in deep polar code construction.

The following Table 2 compares weight distributions for three different codes including [32, 12] polar code, a deep polar code with Construction A, and a deep polar code with Construction B. As demonstrated by a pre-transformation method, two deep polar code constructions may significantly reduce the number of codewords with the minimum weight compared to the polar code. Also, Construction B has fewer codewords with the minimum weight than Construction A. This example explicitly highlights an advantage in using a plurality of connection sets for the deep polar code design.

TABLE 2

COMPARISON OF THE WEIGHT DISTRIBUTIONS

| | [32, 12] | | |
|---|---|---|---|
| Weight | Polar | Construction A | Construction B |
| 0 | 1 | 1 | 1 |
| 8 | 108 | 36 | 28 |
| 12 | 576 | 864 | 896 |
| 16 | 2726 | 2294 | 2246 |
| 20 | 576 | 864 | 896 |
| 24 | 108 | 36 | 28 |
| 32 | 1 | 1 | 1 |

Figure 9:
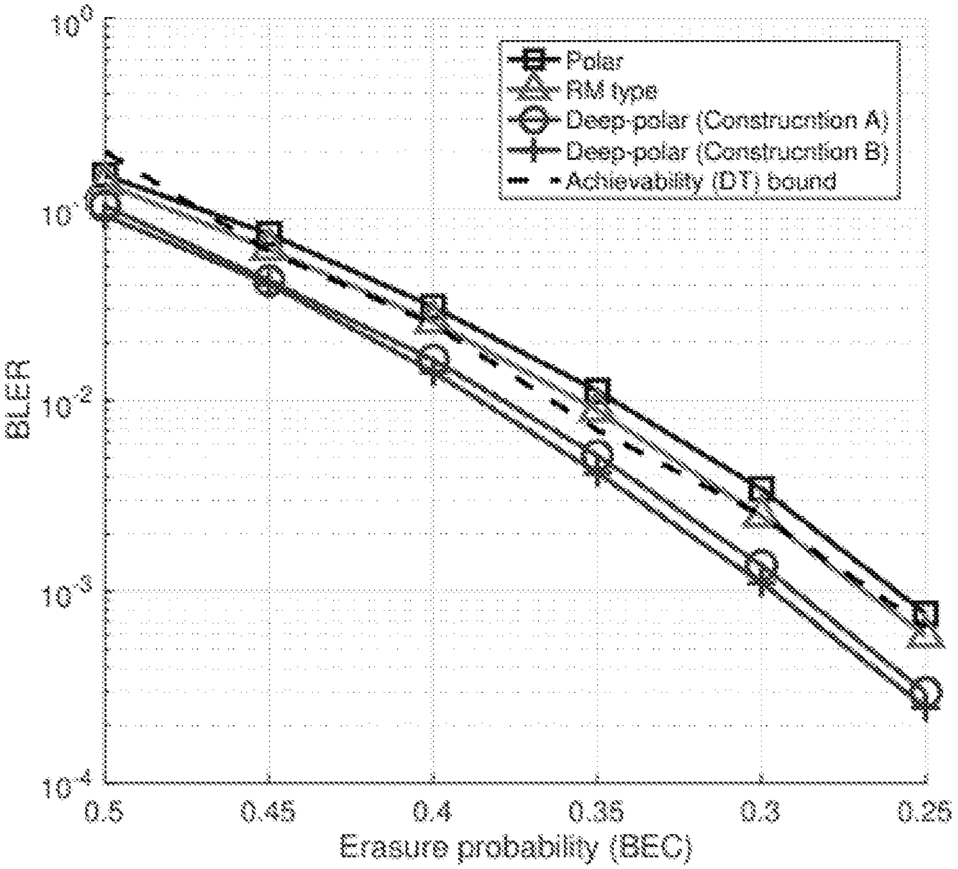
FIG. 9 shows represents that the deep polar code with Construction B has superior performance than all other codes in terms of BLER.

To additionally evaluate the performance, BLERs of two deep polar codes are investigated by comparing polar and RM type codes using ML decoding. FIG. 9 shows results and exhibits that the deep polar code with Construction B has superior performance than all other codes in terms of BLER. The superiority is because the number of codewords with the minimum weight is minimized.

Figure 4:
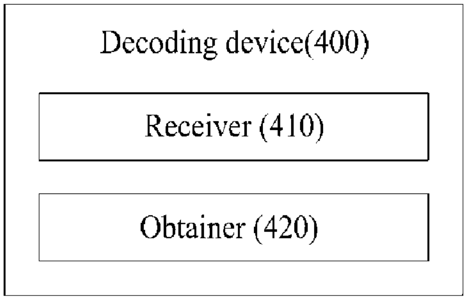
FIG. 4 is a block diagram illustrating a decoding device based on improved deep polarization according to an example embodiment.
Figure 5:
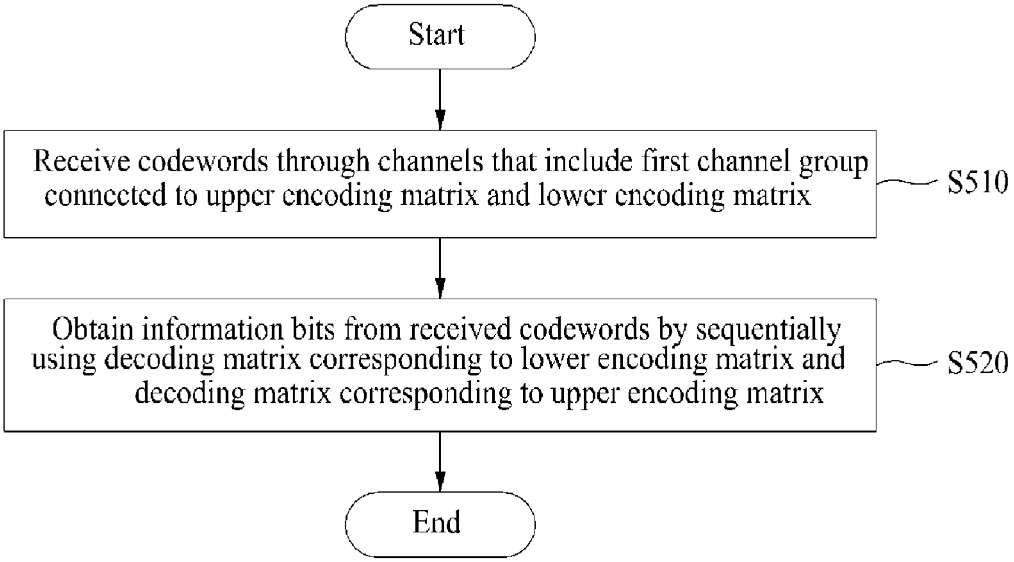
FIG. 5 is a flowchart illustrating a decoding method based on improved deep polarization according to an example embodiment.

FIG. 4 is a block diagram illustrating a decoding device based on improved deep polarization according to an example embodiment, and FIG. 5 is a flowchart illustrating a decoding method based on improved deep polarization according to an example embodiment. The following decoding device and decoding method correspond to an apparatus and a method for decoding codewords generated and transmitted by the encoding device and the encoding method described above with reference to FIGS. 1, 2, and 3A to 3G.

Referring to FIGS. 4 to 5, a decoding device 400 according to an example embodiment refers to an apparatus for decoding a codeword encoded by the encoding device 100 by performing backpropagation-based deep polar decoding and when decoding, uses, as a parity bit, a layer-by-layer frozen bit used for encoding in each of a plurality of layers included in the encoding device 100.

Figure 6A:
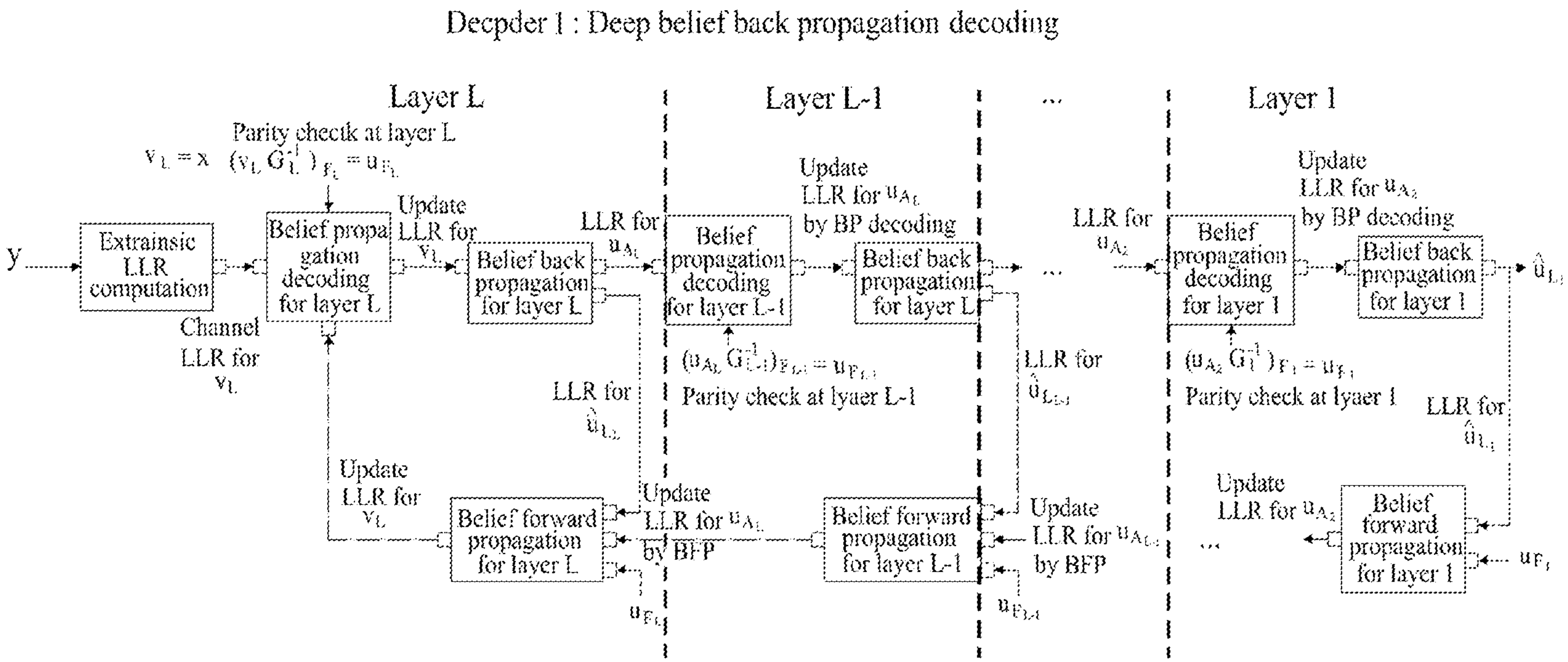
Figure 6B:
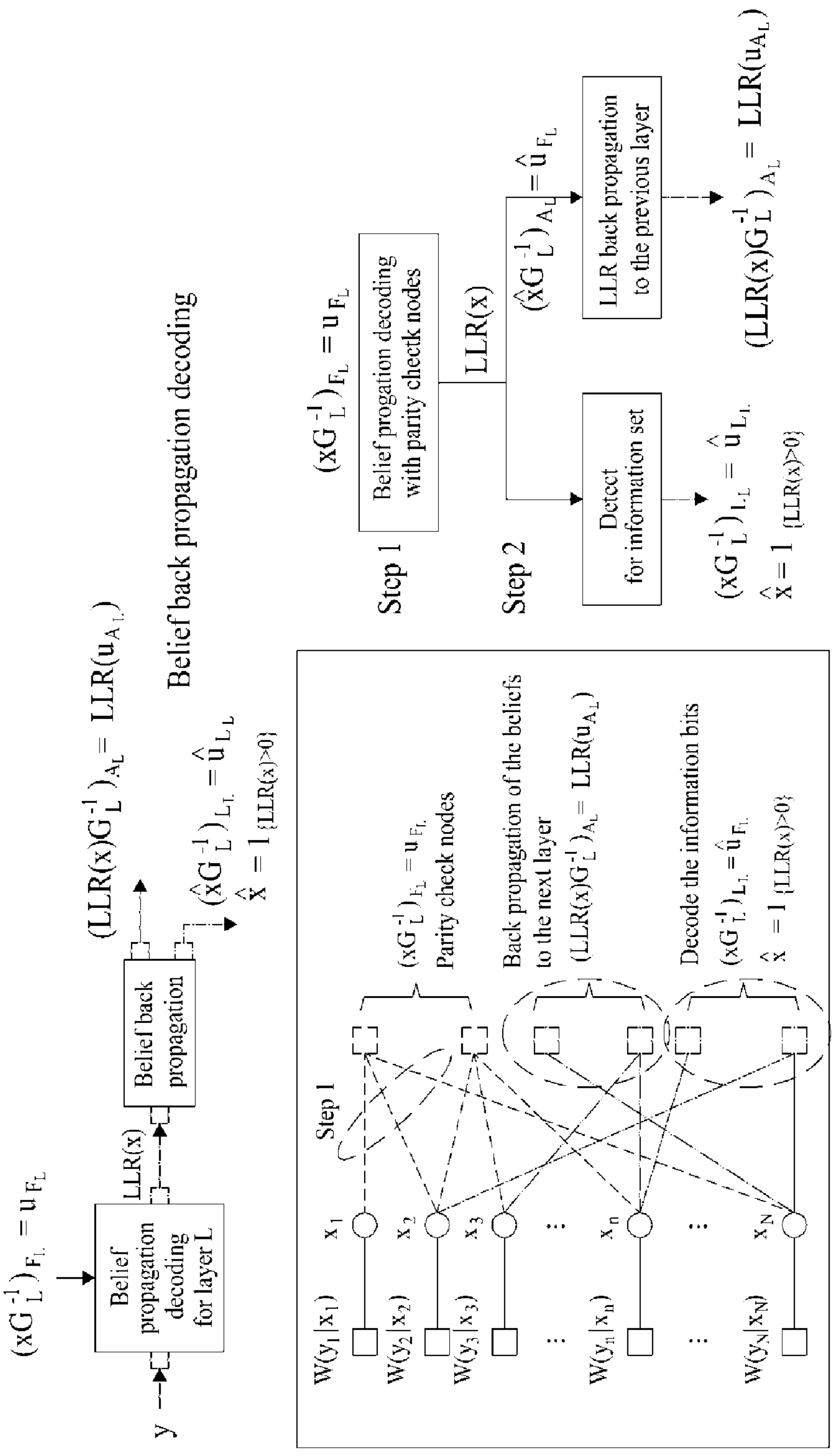
Figure 6C:
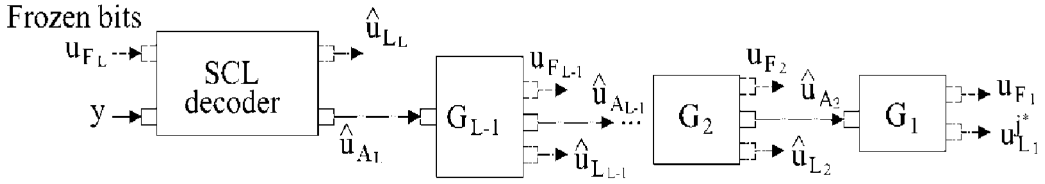
Figure 6D:
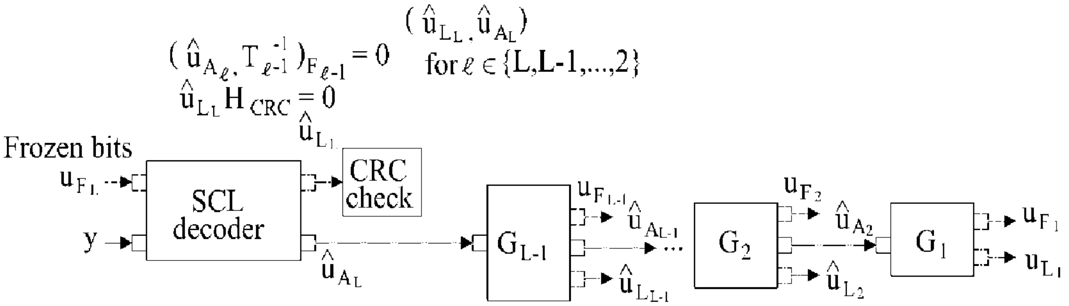

In detail, as illustrated in FIGS. 6C and 6D, the decoding device 400 may use, as parity bits, frozen bits used for encoding of remaining layers excluding a bottom layer provided at an output end of the encoding device 100 among the plurality of layers while decoding a connection bit used for encoding of the bottom layer based on a frozen bit used for encoding of the bottom layer among the plurality of layers.

That is, the decoding device 400 may successively perform parity bit check in a backpropagation structure.

The decoding device 400 may perform decoding using at least some of output values of encoding in each of the plurality of layers previously received from the encoding device 100 and at least some of output values of encoding in each of the plurality of layers received again from the encoding device 100. For example, when decoding using a received signal fails, the decoding device 400 may receive again an output value of an (L-1)-th layer and retry decoding using the output value of the (L-1)-th layer, i.e., a received signal that is received in re-reception and a received signal that is received in a previous reception. If decoding fails, the decoding device 400 may try decoding in the same manner by receiving again an output value of an (L-2)-th layer.

Figure 6E:
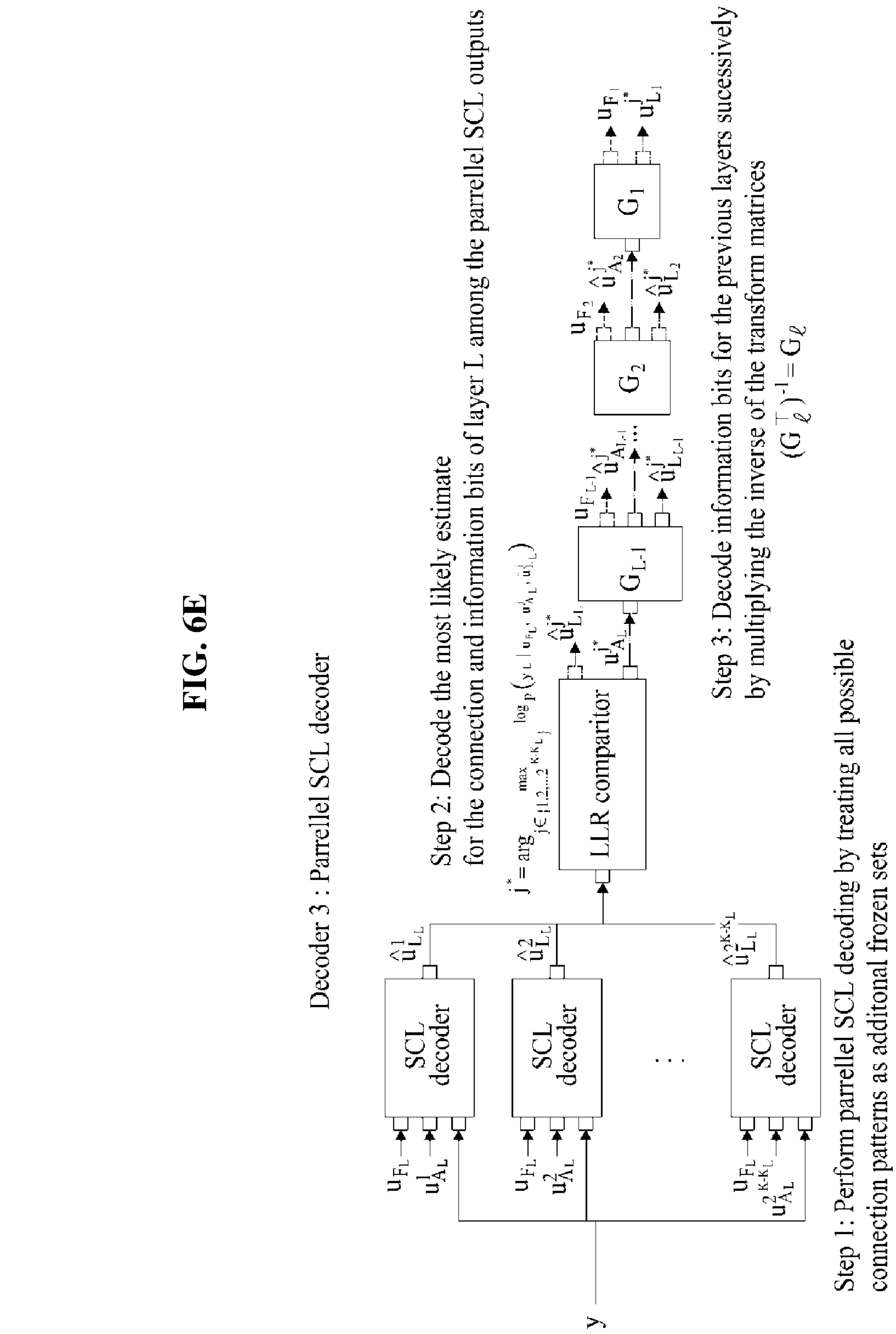

Here, as illustrated in FIG. 6E, the decoding device 400 may decode a connection bit used for encoding of the bottom layer provided at the output end of the encoding device 100 using a pattern of a connection bit available for encoding of the bottom layer as an additional frozen bit.

In detail, the decoding device 400 may generate in advance the pattern of the connection bit available for encoding of the bottom layer, may decode information bits in parallel by simultaneously using the generated connection bit and the frozen bit, and may select and decode an information bit having a highest reliability among the decoded information bits and a connection bit corresponding to the information bit having the highest reliability.

Here, the decoding device 400 may decode an information bit and a connection bit used for encoding of a layer immediately preceding the bottom layer through an inverse matrix of an encoding matrix used for encoding of the layer immediately preceding the bottom layer, based on the decoded connection bit as the connection bit used for encoding of the bottom layer, and may decode an information bit used for encoding of the immediately preceding layer.

For example, the decoding device 400 may decode an information bit and a connection bit used for encoding of an (L-1)-th layer through an inverse matrix of an encoding matrix used for encoding of the (L-1)-th layer that is a layer immediately preceding an L-th layer among the plurality of layers based on a connection bit used for encoding of the L-th layer, and may decode an information bit used for encoding of the (L-1)-th layer.

Also, as illustrated in FIG. 6F, the decoding device 400 may compute a long likelihood ratio (LLR) of a received signal that is received from the encoding device 100 according to a guessing random additive noise decoding (GRAND) rule, may estimate a transmission codeword by inverting bits of the received signal in descending order of the LLR, and may determine the estimated transmission codeword as a codeword transmitted from the encoding device 100 by sequentially verifying a layer-by-layer parity bit of each of the plurality of layers included in the encoding device 100 in a backpropagation structure using the estimated transmission codeword and an inverse matrix of a polar kernel matrix used for encoding of each of the plurality of layers.

That is, when verification of a parity bit check to a top layer succeeds, the decoding device 400 may determine the estimated transmission codeword as a codeword transmitted from the encoding device 100.

For example, the decoding device 400 may compute an LLR of each of connection bits for each of the plurality of layers, may estimate the layer-by-layer connection bit in descending order among the layer-by-layer connection bits, and then may successively backpropagate an LLR of a connection bit of a corresponding immediately preceding layer when verification of the layer-by-layer parity bit succeeds.

Also, as illustrated in FIGS. 6A and 6B, the decoding device 400 may perform a backpropagation LLR that sequentially computes an LLR of a connection bit of each of the plurality of layers included in the encoding device 100 using a belief propagation (BP) algorithm based on a received signal received from the encoding device 100 and a successive encoding structure of the plurality of layers.

Here, the decoding device 400 may sequentially apply the BP algorithm using a parity check matrix present in a null space of an encoding matrix used for encoding of the plurality of layers, in a process of backpropagating the layer-by-layer LLR of each of the plurality of layers.

For example, the decoding device 400 may perform backpropagation for the layer-by-layer LLR, may perform successive encoding using an information bit estimated for each of the plurality of layers and an LLR corresponding to the estimated information bit, and may perform LLR forward propagation of updating the LLR of the connection bit of each of the plurality of layers.

Therefore, the decoding device 400 may alternately perform backpropagation of the LLR and forward propagation of the LLR.

The aforementioned decoding device 400 may include a receiver 410 and an obtainer 420 and may perform a code decoding method of operations S510 and S520 to perform the aforementioned decoding method.

In operation S510, the receiver 410 may receive codewords through channels that include a first channel group connected to a lower encoding matrix and a second channel group connected to an upper encoding matrix and the lower encoding matrix.

Here, the first channel group and the second channel group correspond to the first channel group and the second channel group used in the encoding method according to an example embodiment described above with reference to FIGS. 1, 2, and 3A to 3G.

In operation S520, the obtainer 420 may obtain information bits from the received codewords by sequentially using a decoding matrix corresponding to the lower encoding matrix and a decoding matrix corresponding to the upper encoding matrix.

In detail, the obtainer 420 may perform operation S520 through a first operation of obtaining at least some bits of frozen bits transmitted through the first channel group from the received codewords, a second operation of computing LLR of bits output from the lower encoding matrix using at least some bits of the obtained frozen bits, a third operation of obtaining at least some bits of information bits transmitted through the first channel group using the decoding matrix corresponding to the lower encoding matrix based on the LLR of bits output from the lower encoding matrix, and a fourth operation of obtaining at least some remaining bits of frozen bits transmitted through the second channel group and at least some remaining bits of information bits transmitted through the second channel group using the decoding matrix corresponding to the upper encoding matrix based on the LLR of bits output from the lower encoding matrix.

Here, when computing the LLR in the second operation, the obtainer 420 may not firmly determine a bit of information transmitted from the upper encoding matrix to the lower encoding matrix and thus, may compute the LLR through probability marginalization.

Also, when performing the fourth operation, the, obtainer 420 may perform the fourth operation through a (4-1)-th operation of firmly determining a bit of information transmitted from the upper encoding matrix to the lower encoding matrix based on the LLR of bits output from the lower encoding matrix and a (4-2)-th operation of obtaining at least some remaining bits of frozen bits transmitted through the second channel group and at least some remaining bits of information bits transmitted through the second channel group using the decoding matrix corresponding to the upper encoding matrix based on the bit of information transmitted from the upper encoding matrix to the lower encoding matrix and at least some bits of frozen bits transmitted through the first channel group.

By performing operation S520 through the aforementioned operations, for example, the first operation to the fourth operation, the decoding device 400 may decode and acquire the entire information bits.

A decoding method in a structure that includes layer 1 of the decoding matrix corresponding to the upper encoding matrix and layer 2 of the decoding matrix corresponding to the lower encoding matrix is described above. However, even in a structure in which the number of decoding matrices corresponding to the upper encoding matrix and the number of decoding matrices corresponding to the lower encoding matrix are implemented to be plural and the number of sets of the decoding matrix corresponding to the upper encoding matrix and the decoding matrix corresponding to the lower encoding matrix is implemented to be plural, the aforementioned decoding method may be repeatedly performed to a plurality of sets while being performed to a set of the decoding matrix corresponding to the upper encoding matrix and the decoding matrix corresponding to the lower encoding matrix. Therefore, since the number of decoding matrices corresponding to the upper encoding matrix and the number of decoding matrices corresponding to the lower encoding matrix are implemented to be plural, the receiver 410 and the obtainer 420 may repeatedly operate.

A structure of the decoding device 400 according to an example embodiment will be further described with reference to FIGS. 6A to 6F.

FIGS. 6A to 6F illustrate examples of a structure of a decoding device based on improved deep polarization according to an example embodiment. The decoding device 400 described with reference to FIGS. 4 and 5 may have the structure illustrated in FIGS. 6A to 6F.

Hereinafter, the decoding method of the decoding device 400 according to an example embodiment is described based on deep polar codes that are a family of pre-transformed polar codes.

A. Deep Belief Backpropagation (DBPP) Decoder

As illustrated in FIG. 6A, a DBPP decoder that performs new decoding for deep polar code is disclosed. The DBPP decoder uses recursive belief backpropagation that includes a reverse encoding process of the deep polar code. The main idea of DBPP decoding is to use a reverse process of successive encoding for deep polar codes. The DBPP constructs an L-level task by backward-propagating the reliability of an information bit.

BP decoding in layer L: The DBP decoder initially computes soft information on $x_i$ from channel output $y_i$ for $i\in[N_L]$ as follows.

$$\gamma_i = \log\frac{W(y_i \mid x_i = 1)}{W(y_i \mid x_i = 0)}, \quad \text{<Equation 21>}$$

Let a message from node $v_{L,i}$ identification to variable node $v_{L,j}$ in layer L be $$\gamma^C_{L,i\to j}.$$

Also, a message for identifying node $u_{L,i}$ from the variable node $v_{L,j}$ to $$\gamma^V_{L,i\to j}$$

is displayed. Let $u_{L,j}(v_{L,j})=\mathrm{supp}(\bar{t}_{L,j})\subset \mathcal{F}_{\ell\, L}$ be an index set of identification nodes connected to the variable node $v_{L,j}$. Here, $\bar{t}_{L,j}$ denotes column j of $$T_L^{-1}.$$

Let $V_{L,i}(u_{L,j})=\mathrm{supp}(\tilde{t}_{L,i})\subset N_L$ be an index set of variable nodes connected to identify the node $u_{L,j}$. Here, $\tilde{t}_{L,i}$ denotes an l-th row of $$T_L^{-1}.$$

At each iteration, a variable identification message transmitted from $v_{L,i}$ to $u_{L,j}$ for $j\in u_{L,j}(v_{L,i})$ is updated as follows.

$$\gamma^V_{L,i\to j} = \gamma_i + \sum_{j'\in u_{L,j}(v_{L,j})\setminus\{j\}} \gamma^C_{L,j'\to i} \quad \langle\text{Equation 22}\rangle$$

A variable identification message transmitted from $u_{L,j}$ to $v_{L,i}$ for $j\in V_{L,i}(u_{L,j})$ is computed as follows.

$$\gamma^C_{L,j\to i} = 2\tanh^{-1}\left(\prod_{i'\in V_{L,i}(u_{L,j})\setminus\{i\}} \tanh\left(\frac{1}{2}\gamma^V_{i'\to j}\right)\right) \quad \langle\text{Equation 23}\rangle$$

After the fixed number of iterations, a resulting LLR of $v_{L,i}$ t for $i\in[N_L]$ is computed as follows.

$$\gamma_{L,i} = \gamma_n + \sum_{j\in u_{L,j}(v_{L,j})} \gamma^C_{L,j\to i} \quad \langle\text{Equation 24}\rangle$$

Belief backpropagation (BP) in layer L: Let an LLR vector obtained from BP decoding in layer L be $[\gamma_{L,1}, \ldots, \gamma_{L,N_L}]$. Then, the decoder propagates this soft vector to information and connection input vectors of layer L.

$$\hat{u}_{\mathcal{A}_L} = \left(\hat{v}_L T_L^{-1}\right)_{\mathcal{A}_L} \quad \text{< Equation 25 >}$$

$$\hat{u}_{\mathcal{J}_L} = \left(\hat{v}_L T_L^{-1}\right)_{\mathcal{J}_L} \quad \text{< Equation 26 >}$$

BP decoding in layer L-1: The decoder obtains, from previous layer decoding, $$\hat{u}_{\mathcal{A}_L}$$

that is an LLR value for encoder output of layer L-1 and assigns the same to $$\hat{v}_{L-1} = \hat{u}_{\mathcal{A}_L}.$$

Similar to layer L, the decoder performs BP decoding using a parity check in layer L-1.

$$\left(\hat{v}_{L-1} T_{L-1}^{-1}\right)_{\mathcal{F}_{L-1}} = u_{\mathcal{F}_{L-1}} \quad \text{< Equation 27 >}$$

After a plurality of iterations, BP decoding updates soft information on $\hat{v}_{L-1}$. Let an LLR value updated after BP decoding using an initial value of $\hat{v}_{L-1}$ in a parity check condition of $$\left(\hat{v}_{L-1} T_{L-1}^{-1}\right)_{\mathcal{F}_{L-1}} = u_{\mathcal{F}_{L-1}} \text{ be } \hat{v}'_{L-1}.$$

Then, connection and information bits of layer L-1 are obtained using the updated LLR value, $$\hat{v}'_{L-1}.$$

$$\hat{u}_{\mathcal{A}_{L-1}} = \left(\hat{v}'_{L-1} T_{L-1}^{-1}\right)_{\mathcal{A}_{L-1}} \quad \text{< Equation 28 >}$$

$$\hat{u}_{\mathcal{J}_{L-1}} = (\hat{v}'_{L-1} T'_{L-1})_{\mathcal{J}_{L-1}} \quad \text{< Equation 29 >}$$

BP decoding in layer 1: The same belief backpropagation algorithm is performed in layer 1. Let an LLR value updated after BP decoding using $$\hat{v}_1 = \hat{u}_{\mathcal{A}_2}$$

that is an initial LLR value in the parity check condition be $$\hat{v}'_1.$$

$$\left(\hat{v}'_1 T_1^{-1}\right)_{\mathcal{F}_1} = u_{\mathcal{F}_1} \quad \text{< Equation 30 >}$$

The decoder obtains an LLR value for an information bit of layer 1 using the updated LLR value.

$$\hat{u}_{\mathcal{J}_1} = \left(\hat{v}'_1 T_1^{-1}\right)_{\mathcal{J}_1} \quad \text{< Equation 31 >}$$

Belief forward propagation in layer 1: The decoder obtains, from belief backpropagation to layer 1, an LLR value for information bit $$\hat{u}_{\mathcal{J}_1}.$$

The decoder updates an LLR for $$\hat{v}'_1 \text{ to } \hat{v}''_1$$

using encoder matrix $T_1$ and frozen set $F_1$ as follows.

$$\hat{v}''_1 = \left[\hat{u}_{\mathcal{J}_1}, u_{\mathcal{F}_1}\right] T_1 \quad \text{< Equation 32 >}$$

Belief forward propagation from layer 1 to layer 2:

$$\hat{v}''_1 = u''_{\mathcal{A}_2}.$$

Using belief backpropagation in layer 2 and a connection bit with an LLR value obtained during $$\hat{u}_{I_2},$$

the decoder updates the LLR value for $$\hat{v}''_1 \text{ from } \hat{v}'_1$$

as follows.

$$\hat{v}''_2 = \left[\hat{u}_{\mathcal{J}_2}, u''_{\mathcal{A}_2}, u_{\mathcal{F}_2}\right] T_2 \quad \text{< Equation 33 >}$$

Belief forward propagation from layer L: The same belief forward propagation decoding procedure is repeated up to layer L. Let an output of belief forward propagation in layer L be $$\hat{v}''_L.$$

$$\hat{v}''_L = \left[\hat{u}_{\mathcal{J}_L}, u''_{\mathcal{A}_L}, u_{\mathcal{F}_L}\right] T_L \quad \text{< Equation 34 >}$$

Then, the decoder performs again BP decoding using $$\hat{v}''_L$$

as an initial variable node LLR value.

Belief backpropagation and forward propagation for iteration: FIG. 6B illustrates the entire algorithm.

B. Successive Cancellation List (SCL) Decoder Using Backpropagation Parity Check An efficient SCL decoding method for deep codes using a bit-wise BPPC principle is proposed as illustrated in FIG. 6C. The SCL decoding method uses binary tree search technology that considers all of an information bit $$u_{\mathcal{J}_L}$$

and a connection bit $$u_{\mathcal{A}_L}$$

of layer L. In particular, once $$u_{\mathcal{A}_L}$$

is accurately identified, an information bit $$u_{\mathcal{J}_L}$$

of a previous layer may be correctly decoded for $\ell \in \{1, 2, \ldots, L-1\}$ through a recursive decoding process using $$T_\ell^{-1}.$$

Therefore, it is sufficient to focus on accurately identifying $$u_{\mathcal{A}_L}$$

in the decoder.

To improve a path pruning mechanism in SCL decoding with a limited list size, a new algorithm called the bit-wise BPPC algorithm is introduced. The basic concept of this algorithm is to verify a backpropagation syndrome check condition at a bit level of each layer, particularly, for an element denoted as $u_{L,i}$ in which i belongs to set $A_L$. To simplify the notation, $T_{\ell,1:k}$ is defined as an upper-left submatrix of $T_\ell$ with a dimension of k×k. A pre-transformation matrix of a deep polar code may have a unique property. That is, the inverse of the pre-transformation matrix is the same as the transpose.

$$T_{\ell,1:k}^{-1} = T_{\ell,1:k}, \forall \ell \in [L] \quad \text{< Equation 35 >}$$

When expressing a connection bit of layer $\ell$ that is $$i_1 < i_2 < \ldots < i_{N_{\ell-1}} \text{ as } \hat{u}_{\mathcal{A}_\ell} = \left[\hat{u}_{\ell,i_1}, \hat{u}_{\ell,i_2}, \ldots, \hat{u}_{\ell,i_{N_{\ell-1}}}\right],$$

it may be represented as follows.

$$\hat{u}_{\ell,1:k} = \hat{u}_{\mathcal{A}_\ell,1:k} T_{\ell-1,1:k} \quad \text{< Equation 36 >}$$

Here, $\hat{u}_{\ell,1:k}$ denotes a subsequent that includes first k elements of $\hat{u}_\ell$. Then, two portions are extracted from estimated frozen bits of layer $\ell-1$. One portion is used for parity check and the other portion includes connection bits that are recursively applied using Equation 36. Finally, estimated frozen bits are collected from each $\ell \in [L]$ and the syndrome is verified.

The SCL decoder uses a level-by-level search strategy on a binary tree. At each bit $u_{L,i}$ where $i \in \mathcal{A}_L \cup \mathcal{I}_L$, the decoder extends a list of candidate paths by exploring two paths of the binary tree and by appending $u_{L,i}=0$ or $u_{L,i}=1$ to each candidate path. Consequently, the number of paths is doubled, but limited to a predetermined maximum value S. In contrast to a standard SCL decoder, the proposed approach integrates a bit-wise BPPC method for i∈ AL whenever a new path is generated. This bit-wise BPPC mechanism may easily remove a path that does not satisfy a parity check condition while processing SCL decoding. If a new path satisfies BPPC and is ranked as one of S most reliable paths, the corresponding path is included in the list. On the contrary, if the new path fails BPPC or exhibits lower reliability than the existing S paths in the list, the corresponding path is discarded. This iterative process continues until $i \in [N_L]$. Ultimately, the decoder selects a path with the highest reliability metric as an output. When S=1, the decoder simplifies to an SC decoder using the backpropagation parity check. A deep polar SCL decoding procedure is described in the following Algorithm 1.

<Algorithm 1>

Algorithm 1: SCL-aided Back Propagation Parity Check Decoding

Data: List size S, channel output y, transform matrices $\mathbf{T}_\ell$, information sets $\mathcal{I}_\ell$, connection sets $\mathcal{A}_\ell$, frozen sets $\mathcal{F}_\ell$, ∀l ∈ [L], and frozen bits $\mathbf{u}_{\mathcal{F}_L}$.

Result: Estimated bits $\hat{u}_{\mathcal{I}_L}, \hat{u}_{\mathcal{A}_L}$.

*Initialization*;
$\mathcal{P}_{alive} \leftarrow \{1\}$; $\mathcal{P}_{pool} \leftarrow [2S]/\mathcal{P}_{alive}$;
PM[s] ← 0, ∀s ∈ [S];
*SCL decoding*;
For i = 1, 2, . . . , N do
  For s ∈ $\mathcal{P}_{alive}$ do // path cloning $$\eta_i \leftarrow \log\frac{p(y, \hat{u}_{L,1:i-1}[s] \mid u_{L,i} = 0)}{p(y, \hat{u}_{L,1:i-1}[s] \mid u_{L,i} = 1)};$$

If i ∈ $\mathcal{F}_L$ then // frozen bits
      $\hat{u}_{L,i}[s] \leftarrow u_{L,i}$;

$$PM[s] \leftarrow PM[s] + \log\left(1+e^{-(1-2\hat{u}_{L,i}[s])\eta_i}\right);$$

Else // information bits
      Copy the path s into a new path s' ∈ $\mathcal{P}_{pool}$;
      $\mathcal{P}_{alive} \leftarrow \mathcal{P}_{alive} \cup \{s'\}$; $\mathcal{P}_{pool} \leftarrow \mathcal{P}_{pool}/\{s'\}$;
      $\hat{u}_{L,i}[s] \leftarrow 0$; $\hat{u}_{L,i}[s'] \leftarrow 1$;

$$PM[s] \leftarrow PM[s] + \log\left(1+e^{-(1-2\hat{u}_{L,i}[s])\eta_i}\right);$$

$$PM[s'] \leftarrow PM[s'] + \log\left(1+e^{-(1-2\hat{u}_{L,i}[s'])\eta_i}\right);$$

End
  End
  If i ∈ $\mathcal{A}_L$ then // parity check
    For s ∈ $\mathcal{P}_{alive}$ do
      Apply inverse transform according to (47);

$$\hat{u}_{\mathcal{F}_\ell,1:k_\ell} \leftarrow \text{currently available frozen bits of layer } \ell \in [L];$$

If $\hat{u}_{\mathcal{F}_\ell,1:k_\ell} \neq 0$ for some $\ell$ then
        Kill the path s;
        $\mathcal{P}_{alive} \leftarrow \mathcal{P}_{alive}/\{s\}$; $\mathcal{P}_{pool} \leftarrow \mathcal{P}_{pool} \cup \{s\}$;
      End
    End
  End
  If $|\mathcal{P}_{alive}|$ > S then // list pruning
    $\tau_{threshold}$ ← the Sth smallest PM[s] for s ∈ $\mathcal{P}_{alive}$;
    For s ∈ $\mathcal{P}_{alive}$ do
      If PM[s] > $\tau_{threshold}$ then
        Kill the path s;
        $\mathcal{P}_{alive} \leftarrow \mathcal{P}_{alive}/\{s\}$; $\mathcal{P}_{pool} \leftarrow \mathcal{P}_{pool} \cup \{s\}$;
      End
    End
  End
End Find $s^* \leftarrow \operatorname{argmin}_{s \in \mathcal{P}_{alive}} PM[s]$;

Return $\hat{u}_{\mathcal{I}_L}[s^*]$ and $\hat{u}_{\mathcal{A}_L}[s^*]$;

Decoding complexity: The proposed decoder introduces additional decoding complexity by BPPC task in addition to SCL decoding complexity with a list size of $O(SN_L \log N_L)$. The decoder may perform parity check with the complexity of $O(N_\ell \log N_\ell)$ for each layer $\ell \in 1, 2, \ldots, NL-1$. Consequently, the overall complexity is a sum of complexity required for SCL decoding and the inverse of pre-transformation.

$$O(SN_L \log N_L) + O\left(\sum_{\ell=1}^{L-1} N_\ell \log N_\ell\right) \quad \text{< Equation 37 >}$$

The additional complexity introduced by the inverse of pre-transformation may be ignored when $N_L$ is significantly larger than $N_\ell$ for $\ell \in [L-1]$.

Also, as illustrated in FIG. 6D, the SCL decoder that uses the backpropagation parity check may be implemented in a structure that includes CRC check.

C. Low Latency Decoder Using Parallel-SCL Decoder

Low-latency decoding plays an important role in supporting ultra-reliable and low-latency communications (URLLC) applications. In this sub-section, a method of achieving low-latency decoding of deep polar codes is presented. As illustrated in FIG. 6E, the proposed approach includes estimating an information vector $$u_{\mathcal{I}_L}$$

using standard SCL decoders in parallel, assuming connection bits in layer L indicated as $$u_{\mathcal{A}_L}$$

as an additional frozen set with frozen bits $$u_{\mathcal{F}_L}.$$

Using knowledge of a deep polar encoder, the decoder may generate all connection bit patterns available for layer L.

Based on identifier $K_1+K_2+\ldots K_{L\_1}=K-K_L$, it is possible to infer that there are $$2^{K-K_L}$$

potential connection bit patterns for $$u_{\mathcal{A}_L}.$$

$$u^j_{\mathcal{A}_L} \in \mathbb{F}_2^{N_L-1}$$

may represent a j-th connection bit pattern. Here, $$j \in \{1, 2, \ldots, 2^{K-K_L}\}.$$

Given the j-th connection bit pattern $$u\mathcal{A}_{Lj}$$

and frozen bits of the last layer $$u_{\mathcal{F}_L} = 0,$$

the SCL decoder identifies a most reliable information vector from the list of size S. Denoting the result of SCL decoding for the j-th possible connection bit pattern and frozen bits as $$\hat{u}^j_{\mathcal{I}_L},$$

the decoder selects a most reliable estimate $$\hat{u}_{\mathcal{I}_{Lj^*}}$$

from the set $\{1, 2, \ldots, 2^{K-K_L}\}$.

$$j^* = \arg \max_{j \in \{1,2,\ldots,2^{K-K_L}\}} \log p(y_L \mid u_{\mathcal{F}_L}, u^j_{\mathcal{A}_L}, \hat{u}^j_{\mathcal{I}_L}) \quad \text{< Equation 38 >}$$

The parallel-SCL decoding method may reduce a decoding latency by using the power of parallel processing. However, the hardware complexity of this method may exponentially increase according to the number of information bits encoded in $\ell$ layers. Here, $\ell \in \{1, 2, \ldots, L-1\}$ and $K-K_L$. Therefore, the practical use of this method is limited to a scenario in which a value of $K-K_L$ is small enough.

D. GRAND-Aided Backpropagation Parity Check Decoder

The GRAND-aided backpropagation parity check decoder may be implemented as illustrated in FIG. 6F.

The decoder estimates $x_i$ for $i \in [N_L]$ as follows.

$$\hat{x}_i = \begin{cases} 1 & \log\frac{W(y_i \mid x_i = 1)}{W(y_i \mid x_i = 0)} > 0 \\ 0 & \log\frac{W(y_i \mid x_i = 1)}{W(y_i \mid x_i = 0)} < 0 \end{cases} \quad \text{< Equation 39 >}$$

If decoding fails, that is, if $$(\hat{x}T_L^{-1})_{\mathcal{F}_L} \neq u\mathcal{F}_L,$$

the decoder estimates a channel input vector $\hat{x}$ using a general-purpose method that includes a belief propagation (BP) and guessing random additive noise decoding (GRAND) method.

If $\hat{x}$ is successfully decoded, the decoder generates an input vector of layer L through reverse encoding.

$$[u_{\mathcal{F}_L}, \hat{u}_{\mathcal{A}_L}, \hat{u}_{\mathcal{J}_L}] = \hat{x}T_L^{-1} \quad \text{< Equation 40 >}$$

The decoder obtains an information bit, $$\hat{u}_{\mathcal{J}_L},$$

in layer L from the reverse encoding. Then, the estimated connection bit $$\hat{u}_{\mathcal{A}_L}$$

is propagated as an input for a (L-1) decoding operation.

(L-1) decoding operation: Similar to the previous decoding operation, the decoder applies a syndrome check in layer L-1 using the connection bit obtained from $$\hat{u}_{\mathcal{A}_L}$$

that is a previous operation.

$$(\hat{u}_{\mathcal{A}_L} T_{L-1}^{-1})_{\mathcal{F}_{L-1}} = u_{\mathcal{F}_{L-1}} \quad \text{< Equation 41 >}$$

If the syndrome check fails, the decoder generates another estimate of $$\hat{u}_{\mathcal{A}_L}$$

by adding a possible noise pattern until the syndrome check of Equation 41 succeeds.

Unlike the existing GRAND method, computing a most likely noise pattern in layer L-1 is not apparent since channel reliability is known as $\hat{x}_i$ that is detected in layer L.

$$LLR_{L,i} = \log\frac{W(y_i \mid x_i = 1)}{W(y_i \mid x_i = 0)} \quad \text{< Equation 42 >}$$

From reverse encoding of layer L, the connection bit $$u_{\mathcal{A}_L}$$

is obtained as follows.

$$(\hat{x}T_L^{-1})_{\mathcal{A}_L} = u_{\mathcal{A}_L} \quad \text{< Equation 43 >}$$

$u_{L,i} \in \mathcal{A}_L$ for i$\in \mathcal{A}_L$ may be given by a sum of $\hat{x}_i$ for i$\in \mathcal{N}_{L,i}$ (i-th column vector support set of $T_L^{-1}$).

Therefore, the reliability for $u_{L,i}$ computed as follows.

$$LLR_{L-1,i} = \sum_{j=N_{L,i}} |LLR_{L,j}| \quad \text{< Equation 44 >}$$

Noise patterns are sequentially added in descending order of reliability values for $u_{L,i}$, that is, $$LLR_{L-1,i} < LLR_{L-1,i_2} < \cdots < LLR_{L-1,i_{N_{L-1}}}$$

until the parity check condition $$(\hat{u}_{\mathcal{A}_L} T_{L-1}^{-1})_{\mathcal{F}_{L-1}} = u_{\mathcal{F}_{L-1}}$$

is satisfied using the reliability for $u_{L,i}$ for i$\in A_L$.

If the syndrome check is successfully completed, the decoder obtains estimate of connection and information bits in layer L-1 using the inverse matrix $$T_{L-1}^{-1}$$

of TL-1, as follows.

$$\hat{u}_{\mathcal{A}_{L-1}} = (\hat{u}_{\mathcal{A}_L} T_{L-1}^{-1})_{\mathcal{A}_{L-1}} \quad \text{< Equation 45 >}$$

$$\hat{u}_{\mathcal{J}_{L-1}} = (\hat{u}_{\mathcal{A}_L} T_{L-1}^{-1})_{\mathcal{J}_{L-1}} \quad \text{< Equation 46 >}$$

First operation decoding from L-2: The BPPC decoder recursively propagates the estimated connection bit $$\hat{u}_{\mathcal{A}_\ell}$$

to a reverse layer while performing a sequential syndrome check for each layer. Then, the decoder generates information bit $$\hat{u}_{\mathcal{J}_\ell}$$

for each layer until a first layer is reached.

The BPPC decoder reverses an encoding process of deep polar codes. The polar transformation matrix may be selected as an encoding matrix of all layers. In detail, $$T_L = G_{N_L} \text{ for } \ell \in 1, \ldots, L-1, \text{ and } T_L = G_{N_L} \text{ and } T_\ell = G_{N_\ell}^T.$$

Since an inverse matrix of this encoding matrix is also a polar transformation matrix, that is, $$T_\ell^{-1} = G_{N_\ell} \text{ and } T_L^{-1} = G_{N_L}^T,$$

BPPC decoding complex is the same as the encoding complexity, that is, $$\mathcal{O}\left(\sum_{\ell=1}^{L} N_\ell \log (N_\ell)\right).$$

Also, in each operation, GRAND type decoding requires significant additional complexity.

The apparatuses described herein may be implemented using hardware components, software components, and/or combination thereof. For example, the apparatuses and components described herein may be implemented using one or more general-purpose or special purpose computers, such as, for example, a processor, a controller, an arithmetic logic unit (ALU), a digital signal processor, a microcomputer, a field programmable array (FPA), a programmable logic unit (PLU), a microprocessor, or any other device capable of responding to and executing instructions in a defined manner. A processing device may run an operating system (OS) and one or more software applications that run on the OS. The processing device also may access, store, manipulate, process, and create data in response to execution of the software. For purpose of simplicity, the description of a processing device is used as singular; however, one skilled in the art will appreciate that the processing device may include multiple processing elements and/or multiple types of processing elements. For example, the processing device may include multiple processors or a processor and a controller. In addition, different processing configurations are possible, such as parallel processors.

The software may include a computer program, a piece of code, an instruction, or some combinations thereof, for independently or collectively instructing or configuring the processing device to operate as desired. Software and/or data may be embodied in any type of machine, component, physical equipment, virtual equipment, computer storage medium or device, or in a propagated signal wave capable of providing instructions or data to or being interpreted by the processing device. The software also may be distributed over network coupled computer systems so that the software is stored and executed in a distributed fashion. The software and data may be stored by one or more computer readable storage mediums.

The methods according to the example embodiments may be recorded in non-transitory computer-readable media including program instructions to implement various operations embodied by a computer. Also, the media may include, alone or in combination with the program instructions, data files, data structures, and the like. Program instructions stored in the media may be those specially designed and constructed for the example embodiments, or they may be well-known and available to those having skill in the computer software arts. Examples of the media include magnetic media such as hard disks, floppy disks, and magnetic tapes; optical media such as CD ROM disks and DVDs; magneto-optical media such as floptical disks; and hardware devices that are specially to store and perform program instructions, such as read-only memory (ROM), random access memory (RAM), flash memory, and the like. Examples of program instructions include both a machine code, such as produced by a compiler, and files containing a higher level code that may be executed by the computer using an interpreter.

While this disclosure includes specific example embodiments, it will be apparent to one of ordinary skill in the art that various alterations and modifications in form and details may be made in these example embodiments without departing from the spirit and scope of the claims and their equivalents. For example, suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A communication encoding apparatus comprising:

a memory storing instructions;

a communication interface; and a processor coupled to the memory and the communication interface, wherein the processor is configured to execute the instructions to:

identify a plurality of layers for polar coding;

generate a codeword by performing encoding through the plurality of layers; and control the communication interface to transmit a signal using the generated codeword through a physical channel, wherein the encoding includes applying at least one polar kernel matrix included in polar kernel matrices to respective layers of the plurality of layers, wherein the encoding includes successively and alternately using an upper triangular matrix and a lower triangular matrix for the polar kernel matrix respectively connected to the plurality of layers.

2. The communication encoding apparatus of claim 1, wherein the polar kernel matrices respectively connected to the plurality of layers have different matrix sizes, or wherein at least one polar kernel matrix included in the polar kernel matrices is connected to each of the plurality of layers.

3. The communication encoding apparatus of claim 2, wherein the polar kernel matrices respectively connected to the plurality of layers have smaller matrix sizes as going along an upper layer from an output end to an input end of the communication encoding apparatus.

4. The communication encoding apparatus of claim 3, wherein polar kernel matrices respectively connected to remaining layers excluding a bottom layer provided at the output end of the communication encoding apparatus among the plurality of layers have a transpose relationship with a polar kernel matrix connected to the bottom layer.

5. The communication encoding apparatus of claim 1, wherein a polar kernel matrix used in a layer immediately preceding a bottom layer provided at an output end of the communication encoding apparatus among the plurality of layers is the upper triangular matrix when a polar kernel matrix used in the bottom layer is the lower triangular matrix and the lower triangular matrix when the polar kernel matrix used in the bottom layer is the upper triangular matrix.

6. The communication encoding apparatus of claim 1, wherein the communication encoding apparatus generates the codeword using a successive encoding method based on a linear or nonlinear function using a partial connection between the plurality of layers, or wherein the communication encoding apparatus generates the codeword using a successive encoding method of using cyclic redundancy check (CRC) precoding for at least some of information bits.

7. The communication encoding apparatus of claim 1, wherein the communication encoding apparatus uses at least one bit among an information bit, a connection bit, and a frozen bit as an input bit of encoding in each of the plurality of layers and an input position of each of the information bit, the input bit, and the frozen bit is configured to not overlap.

8. The communication encoding apparatus of claim 7, wherein a codeword output as an output value of encoding in each of the plurality of layers is determined based on a polar kernel matrix used in each of the plurality of layers, the connection bit, and the information bit and is used as an input of a connection bit of the encoding in an immediately following layer.

9. The communication encoding apparatus of claim 7, wherein an input position of an information bit of encoding in each of the plurality of layers is selected as a position at which a bit channel capacity is greater than or equal to a preset value based on a channel status and a polar kernel matrix used in each of the plurality of layers, and an input position of a connection bit of encoding in each of the plurality of layers is selected as at least one position at which the bit channel capacity is greater than or equal to the preset value excluding a position at which the information bit is assigned among row positions at which a weight size of rows of the polar kernel matrix used in each of the plurality of layers is greater than or equal to the preset value.

10. A communication decoding apparatus comprising:

a memory storing instructions;

a communication interface; and a processor coupled to the memory and the communication interface, wherein the processor is configured to execute the instructions to:

control the communication interface to receive a signal through a physical channel; and perform decoding on the received signal, wherein, in performing the decoding, the processor is configured to use frozen bits, respectively corresponding to a plurality of layers associated with the received signal, as parity bits, wherein the communication decoding apparatus uses, as parity bits, frozen bits used for encoding of remaining layers excluding a bottom layer provided at an output end of a communication encoding apparatus among the plurality of layers while decoding a connection bit used for encoding of the bottom layer based on a frozen bit used for encoding of the bottom layer among the plurality of layers.

11. The communication decoding apparatus of claim 10, wherein the communication decoding apparatus successively performs parity bit check in a backpropagation structure.

12. The communication decoding apparatus of claim 10, wherein the communication decoding apparatus performs decoding using at least some of output values of encoding in each of the plurality of layers previously received from the communication encoding apparatus and at least some of output values of encoding in each of the plurality of layers received again from the encoding device.

13. The communication decoding apparatus of claim 10, wherein the communication decoding apparatus decodes a connection bit used for encoding of the bottom layer provided at the output end of the communication encoding apparatus among the plurality of layers using a pattern of a connection bit available for encoding of the bottom layer as an additional frozen bit.

14. The communication decoding apparatus of claim 13, wherein the communication decoding apparatus generates in advance the pattern of the connection bit available for encoding of the bottom layer, decodes information bits in parallel by simultaneously using the generated connection bit and the frozen bit, and selects and decodes an information bit having a highest reliability among the decoded information bits and a connection bit corresponding to the information bit having the highest reliability.

15. The communication decoding apparatus of claim 14, wherein the communication decoding apparatus decodes an information bit and a connection bit used for encoding of a layer immediately preceding the bottom layer through an inverse matrix of an encoding matrix used for encoding of the layer immediately preceding the bottom layer, based on the decoded connection bit as the connection bit used for encoding of the bottom layer, and decodes an information bit used for encoding of the immediately preceding layer.

16. The communication decoding apparatus of claim 15, wherein the communication decoding apparatus decodes an information bit and a connection bit used for encoding of an (L-1)-th layer through an inverse matrix of an encoding matrix used for encoding of the (L-1)-th layer that is a layer immediately preceding an L-th layer among the plurality of layers based on a connection bit used for encoding of the L-th layer, and decodes an information bit used for encoding of the (L-1)-th layer, wherein L is a positive integer greater than 1.

17. A communication decoding apparatus for performing code decoding, wherein the communication decoding apparatus computes a long likelihood ratio (LLR) of a received signal that is received from a communication encoding apparatus according to a guessing random additive noise decoding (GRAND) rule, estimates a transmission codeword by inverting bits of the received signal in descending order of the LLR, and determines the estimated transmission codeword as a codeword transmitted from the communication encoding apparatus by sequentially verifying a layer-by-layer parity bit of each of a plurality of layers included in the communication encoding apparatus in a backpropagation structure using the estimated transmission codeword and an inverse matrix of a polar kernel matrix used for encoding of each of the plurality of layers.

18. The communication decoding apparatus of claim 17, wherein the communication decoding apparatus computes an LLR of each of connection bits for each of the plurality of layers, estimates a layer-by-layer connection bit in descending order among layer-by-layer connection bits, and then successively backpropagates an LLR of a connection bit of a corresponding immediately preceding layer when verification of the layer-by-layer parity bit succeeds.

19. A communication decoding apparatus for performing code decoding, wherein the communication decoding apparatus performs a backpropagation long likelihood ratio (LLR) that sequentially computes an LLR of a connection bit of each of a plurality of layers included in a communication encoding apparatus using a belief propagation (BP) algorithm based on a received signal received from the communication encoding apparatus and a successive encoding structure of the plurality of layers.

20. The communication decoding apparatus of claim 19, wherein the communication decoding apparatus sequentially applies the BP algorithm using a parity check matrix present in a null space of an encoding matrix used for encoding of the plurality of layers, in a process of backpropagating a layer-by-layer LLR of each of the plurality of layers.

21. The communication decoding apparatus of claim 19, wherein the communication decoding apparatus performs backpropagation for a layer-by-layer LLR, performs successive encoding using an information bit estimated for each of the plurality of layers and an LLR corresponding to the estimated information bit, and performs LLR forward propagation of updating the LLR of the connection bit of each of the plurality of layers.

22. The communication decoding apparatus of claim 21, wherein the communication decoding apparatus alternately performs backpropagation of the LLR and forward propagation of the LLR.

* * * * *